(12) United States Patent
Girolami et al.

(10) Patent No.: US 11,008,353 B2
(45) Date of Patent: May 18, 2021

(54) METAL COMPLEXES FOR DEPOSITING FILMS AND METHOD OF MAKING AND USING THE SAME

(71) Applicant: The Board of Trustees of the University of Illinois, Urbana, IL (US)

(72) Inventors: Gregory S. Girolami, Champaign, IL (US); Sumeng Liu, Nanjin (CN)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 16/035,348

(22) Filed: Jul. 13, 2018

(65) Prior Publication Data

US 2019/0077819 A1 Mar. 14, 2019

Related U.S. Application Data

(60) Provisional application No. 62/532,452, filed on Jul. 14, 2017.

(51) Int. Cl.
| | | |
|---|---|---|
| *C07F 15/00* | (2006.01) | |
| *C23C 16/455* | (2006.01) | |
| *C07F 1/02* | (2006.01) | |
| *C23C 16/18* | (2006.01) | |

(52) U.S. Cl.
CPC ........... *C07F 15/0086* (2013.01); *C07F 1/02* (2013.01); *C07F 15/0033* (2013.01); *C07F 15/0073* (2013.01); *C23C 16/18* (2013.01); *C23C 16/45553* (2013.01)

(58) Field of Classification Search
CPC .... C07F 1/02; C07F 15/0033; C07F 15/0073; C07F 15/0086; C23C 16/45553
See application file for complete search history.

(56) References Cited

U.S. PATENT DOCUMENTS

| | | | |
|---|---|---|---|
| 3,969,386 A * | 7/1976 | Ballard | ........... C07F 5/00 556/12 |
| 6,099,903 A | 8/2000 | Kaloyeros et al. | |
| 6,110,529 A | 8/2000 | Gardiner et al. | |
| 6,126,996 A | 10/2000 | Kirlin et al. | |
| 7,838,329 B2 | 11/2010 | Hunks et al. | |

(Continued)

OTHER PUBLICATIONS

Weatherhead et al., "Mo-catalyzed asymmetric olefin metathesis in target-oriented synthesis: Enantioselective synthesis of (+)- aficanol," Proceedings of the National Academy of Sciences of the United States of America, vol. 101, No. 16, Apr. 2004, pp. 5805-5809. (Year: 2004).*

(Continued)

*Primary Examiner* — Clinton A Brooks
(74) *Attorney, Agent, or Firm* — Leydig, Voit & Mayer, Ltd.

(57) ABSTRACT

Provided herein are metal-ligand complexes, and associated methods, characterized by formula $ML_xD_y$; wherein: M is a metal; x is equal to the oxidation state of M; each D is independently a neutral coordinating ligand; y is zero or an integer selected from the range of 1 to 4; and each L is independently a mono-anionic ligand. L may be a $\eta^1,\eta^2$-β, β-disubstituted-ω-alkenyl ligand.

33 Claims, 9 Drawing Sheets

(56) References Cited

U.S. PATENT DOCUMENTS 8,362,220 B2  1/2013  Girolami et al.

OTHER PUBLICATIONS

Baily et al., "Asymmetric Cyclization of Achiral Olefinic Organolithiums Controlled by a Stereogenic Lithium: Intramolecular Carbolithiation in the Presence of (−)-Sparteine," J. Am. Chem. Soc. 2000, 122, 6787-6788. (Year: 2000).*
CAS No. 81069-81-0, Nov. 16, 1984, p. 1 (Year: 1984).*
Physical Review C 74, 044602 (2006), pp. 044602-1 through 044602-9.*
Kelly et al. Polyhedron (1989), 8(4), 433-45.*
Austin et al., "Atomic Layer Deposition of Ruthenium and Ruthenium Oxide Using a Zero-Oxidation State Precursor", *Chemistry of Materials*, 29(3): 1107-1115 (2017).
Bottrill et al., "Reactions of co-ordinated ligands. Part 20. Insertion and ring-forming reactions of fluorinated olefins with $\eta^3$-allylcobalt species; molecular and crystal structure of dicarbonyl[4—5-$\eta$-1,2-difluoro-1,2-bis(trifluoromethyl)pent-4-enyl](trimethyl phosphite)cobalt", *J. Chem. Soc., Dalton Trans.*, 0(11): 1671-1678 (1979).
Brandow et al., "Ancillary Ligand and Olefin Substituent Effects on Olefin Dissociation for Cationic Zirconocene Complexes Bearing a Coordinated Pendant Olefin", *Organometallics*, 20(20): 4253-4261 (2001).
Ermer et al., "Kinetics and conformation in the reversible insertion of an alkene into a platinum-carbon bond in a chelated (pentenyl)platinum complex", *Organometallics*, 12(7): 2634-2643 (1993).
Fischer, "Reduction of Platinum Corrosion in Molten Glass", *Platinum Metal Rev.*, 36(1): 14-25 (1992).
Flood et al., "Reversible formal alkene insertion into a chelated platinum-alkyl bond", *J. Am. Chem. Soc.*, 106(20): 6076-6077 (1984).
Green et al., "Reactions of co-ordinated ligands. Part VII. Tetrafluoroethylene with $\pi$-allyliridium(I) complexes", *J. Chem. Soc., Dalton Trans.*, 0(12): 1128-1137 (1975).
Keitoku et al., "Preparation of Co—Cr—Pt alloy film with high perpendicular coercivity and large negative nucleation field", *Journal of Magnetism and Magnetic Materials*, 235(1-3): 34-39 (2001).
Lehmkuhl et al., "Stabilisierung von $\eta^1$, $\eta^2$-4-Alkenylnickel-Komplexen", *J. Organomet. Chem.*, 216(3): C41-C44 (1981).
Maudez et al., "New Dimethyl(norbornadienyl)platinum(II) Precursors for Platinum MOCVD", *Chemical Vapor Deposition*, 20(1-2-3): 59-68 (2014).
Omae, "Organometallic Intramolecular $\pi$-Olefin-Metal Coordination Compounds", *Angew. Chem. Int. Ed. Engl.*, 21(12): 889-902 (1982).
Schneider et al., "Minimizing the Carbon Content of Thin Ruthenium Films by MOCVD Precursor Complex Design and Process Control", *Chemical Vapor Deposition*, 13(8): 389-395 (2007).
Tagge et al., "Synthesis of a Novel Volatile Platinum Complex for Use in CVD and a Study of the Mechanism of Its Thermal Decomposition in Solution", *J. Am. Chem. Soc.*, 118(11): 2634-2643 (1996).
Thurier et al., "Platinum OMCVD processes and precursor chemistry", *Coordination Chemistry Reviews*, 252(1-2): 155-169 (2008).
Wu et al., "Iridium Coating: Processes, Properties and Application. Part I", *Johnson Matthey Technology Review*, 61(1): 16-28 (2017).
Casey et al. (1995) "Synthesis and Spectroscopic Characterization of the $d^0$ Transition Metal-Alkyl-Alkene Complex Cp*$_2$YCH$_2$CH$_2$C(CH$_3$)$_2$CH=CH$_2$," J. Am. Chem. Soc. 117(38):9770-9771.
Casey et al. (2000) "Measurement of Barriers for Alkene Dissociation and for Inversion at Zirconium in a $d^0$ Zirconium-Alkyl-Alkene Complex," Organometallics 19(19):3970-3977.
Collman et al. (1980) "Principles and Applications of Organotransition Metal Chemistry," University Science Books, Mill Valley, California: p. 27.
Liu et al. (Apr. 2019) "Lithium-Olefin $\pi$-Complexes and the Mechanism of Carbolithiation: Synthesis, Solution Behavior, and Crystal Structure of (2,2-Dimethylpent-4-en-1-yl)lithium," Organometallics 38(9):2199-2210.
"Allyltrimethylsilane(762-72-1) $^1$H NMR," https://www.chemicalbook.com/SpectrumEN_762-72-1_1HNMR.htm, downloaded Jul. 2, 2020.
Burns et al. (2004) "The Actinides," in Comprehensive Coordination Chemistry II, vol. 3, Ch. 3.3, published by Elsevier Ltd., Amsterdam, pp. 189-192.
Casey et al. (2001) "Models for Intermediates in Metallocene-Catalyzed Alkene Polymerization: Alkene Dissociation from Cp$_2$Zr[$\eta^1$, $\eta^2$-CH$_2$Si(CH$_3$)$_2$CH$_2$CH=CH$_2$][B(C$_6$F$_5$)$_4$]," Organometallics 20, 4262-4265.
Collier et al. (1973) "Silylmethyl and Related Complexes. Part I. Kinetically Stable Alkyls of Titanium(iv), Zirconium(iv), and Hafnium(iv)," J. Chem. Soc., Dalton Trans., pp. 445-451.
Cotton et al. (1980), "Advanced Inorganic Chemistry," excerpt only, John Wiley & Sons, Inc., p. 693.
Rausch et al. (2015), "One ligand fits all: lanthanide and actinide sandwich complexes comprising the 1,4-bis(trimethylsilyl)cyclooctatetraenyl (=COT") ligand," New J. Chem., 39,7656-7666.
Solomon et al. (2010), "The coordination chemistry of silyl-substituted allyl ligands," Dalton Trans., 39, 2469-2483.

* cited by examiner

METAL COMPLEXES FOR DEPOSITING FILMS AND METHOD OF MAKING AND USING THE SAME

CROSS-REFERENCE TO RELATED APPLICATIONS

This application claims the benefit of priority to U.S. Provisional Patent Application No. 62/532,452, filed Jul. 14, 2017, which is hereby incorporated by reference in its entirety.

STATEMENT REGARDING FEDERALLY SPONSORED RESEARCH OR DEVELOPMENT

This invention was made with government support under Award Number CHE 13-62931 awarded by the National Science Foundation. The government has certain rights in the invention.

BACKGROUND OF INVENTION

The fabrication of conformal films such as metals, metal oxides, metal nitrides, and other metal-containing substances is becoming increasingly important in the microelectronics industry, as device feature sizes continue to become smaller. In particular, thin films of insulators and conductors need to be conformally deposited inside narrow, deep holes and trenches, in order to serve as wires, diffusion barriers, adhesion layers, encapsulating layers, and other functions. Physical vapor deposition (PVD) methods such as evaporation and sputtering are currently used to deposit such films, but the high sticking coefficients of the PVD flux leads to "line of sight" depositions that cannot afford conformal coatings in very small features. Chemical vapor deposition (CVD), on the other hand, often affords conformal films owing to the smaller surface reaction probabilities of CVD precursors, which enables the precursors to reach the bottoms of deep features.

In CVD, a precursor or set of precursors that contain the desired elements is vaporized and passed over a hot substrate. Subsequent decomposition of the precursor, sometimes in the presence of a reactant gas, affords thin films of the desired material on the substrate. A variant of CVD is known as atomic layer deposition (ALD); in this method, two or more reactant gases are passed alternately over the heated substrate, with intervening evacuation steps. The precursors used in CVD and ALD processes should be volatile enough to be deliverable to the substrate, and thermally stable enough to be storable at (and preferably slightly above) room temperature for long periods. Decomposition reactions on the substrate surface should also occur to give a film with the desired composition, and should afford reaction byproducts that are volatile and thus can be swept away without leaving contaminants in the film.

Thin films of metals or metal-containing solid materials are very useful as protective coatings, conductive materials in microelectronics, catalysts, data storage media, and other applications owing to their outstanding properties. For example, because of their high melting point, high strength, and resistance to corrosion, platinum and platinum alloys can withstand the abrasive action of molten glass and thus are used in glass molding components (Fisher, *Platinum Metal Reviews* 1992, 36, 14-25). Co—Cr—Pt thin films, which have perpendicular magnetic coercivities, $H_c(\perp)$, greater than 5000 Oe are used in data storage (Keitoku et al., *Journal of Magnetism and Magnetic Materials* 2001, 235, 34-39). Due to its high melting point (2447° C.) and resistance to chemical attack, iridium coatings are used for crucibles for the synthesis of high purity metal oxide single crystals (Wu et al., *Johnson Matthey Technology Review* 2017, 61(1), 16-28). Palladium and platinum are widely used in electronics applications because of their high electrical conductivities and durability. Ruthenium metal has a low bulk resistivity (7.1 μΩ·cm), a high work function (4.7 eV), and low solid solubility with strong adhesion to Cu, making it an attractive barrier metal and seed layer for Cu electroplating (Keitoku et al., *Journal of Magnetism and Magnetic Materials* 2001, 235, 34-39; Wu et al., *Johnson Matthey Technology Review* 2017, 61, 16-28; and Austin et al., *Chemistry of Materials* 2017, 29, 1107-1115).

As seen in PVD of other materials, PVD of metals or metal-containing solid materials has limited ability to provide conformal coatings inside holes and trenches with high aspect ratios, although it works well for coatings on flat surfaces. For example, deposition of Co—Cr—Pt alloy thin films by magnetron sputtering has been reported (Keitoku et al., *Journal of Magnetism and Magnetic Materials* 2001, 235, 34-39).

CVD and ALD methods for depositing films of metals or metal-containing solid materials have been reported. However, the precursors employed generally suffer from one or more shortcomings, such as low volatility, inappropriate decomposition temperature, air sensitivity, or generation of hazardous byproducts. In addition, many thin films of late transition metals suffer from excess carbon impurities in the films. For example, the most widely used Pt CVD and ALD precursor, (MeCp)PtMe3 is an air sensitive solid which leaves carbon impurities in the Pt film if no reactive gas is used. Carrying out the depositions in the presence of a reactive gas such as $O_2$ or $H_2$ reduces the carbon impurities, but film oxidation and/or gas phase precipitation become problematic (Thurier et al., *Coordination Chemistry Reviews* 2008, 252, 155-169; Schneider, et al., *Chemical Vapor Deposition* 2007, 13, 389-395; Maudez, et al., *Chemical Vapor Deposition* 2014, 20, 59-68).

One CVD precursor of particular relevance to the invention below is cis-bis(pent-4-en-1-yl)platinum (Tagge, C. D.; Simpson, R. D.; Bergman, R. G.; Hostetler, M. J.; Girolami, G. S.; Nuzzo, R. G., "Synthesis of a novel volatile platinum complex for use in CVD and a study of the mechanism of its thermal decomposition in solution." *J. Am. Chem. Soc.* 1996, 118, 2634-2643). This compound is an air and moisture-stable, low melting (40-41° C.), volatile solid. Unfortunately, it is not particularly robust thermally: it decomposes within 2 weeks at room temperature with formation of pentadienes and pentenes, owing to its susceptibility to beta-hydrogen elimination. This compound affords films that contain Pt under appropriate CVD conditions, but it would be far more useful if it could be stored indefinitely at room temperature.

Provided herein are new volatile complexes and associated methods, which address these and other challenges, for the deposition of metals and other solids, such as metal oxides ($MO_x$), metal nitrides ($MN_x$), metal carbides ($MC_x$), metal borides ($MB_x$) and other binary and higher-order phases of superior quality and performance characteristics.

SUMMARY OF THE INVENTION

Provided herein is a new class of metal-ligand complexes. The metal-ligand complexes disclosed herein may be vapor-to-solid precursors for the deposition of solid materials. For example, the metal-ligand complexes may be CVD precursors. The metal-ligand complexes address challenges associated with conventional CVD precursors, such as low volatility, too high or too low decomposition temperatures, air sensitivity, toxicity or toxicity of decomposition products, and poor shelf life. For example, the metal-ligand complexes may have a shelf-life of at least two weeks or at least a year. The metal-ligand complexes disclosed herein may be used for the deposition of solid materials, such as films or nanostructures, including those comprising metals that are difficult to deposit using conventional complexes, such as Pt. Provided herein are also vapor-to-solid precursors, which comprise any of the metal-ligand complexes disclosed herein. The vapor-to-solid precursors disclosed herein provide for a wide range of operating conditions and solid materials that may be deposited. Provided herein are also associated methods, including methods for depositing solid material on a substrate, via metal-ligand complexes disclosed herein, and methods for forming the metal-ligand complexes disclosed herein. Provided herein are also metal-ligand complexes and methods for hydrosilylation of starting compounds.

In some aspects, a metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

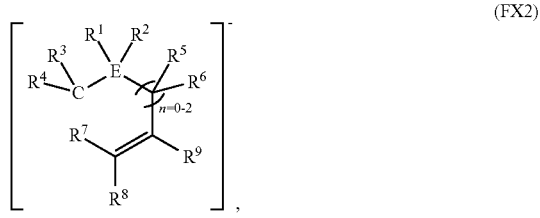

(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of these metal-ligand complexes, at least one of $R^1$ and $R^2$ is not a fluoride (F—) or a trifluoromethyl ($CF_3$—) group. In some embodiments of these metal-ligand complexes, at least one of $R^1$ and $R^2$ is not a fluoride or a $C_1$-$C_6$ fluoroalkyl. In some embodiments of these metal-ligand complexes, each of both $R^1$ and $R^2$ is not a fluoride or a trifluoromethyl. In some embodiments of these metal-ligand complexes, each of both $R^1$ and $R^2$ is not a fluoride or a $C_1$-$C_6$ fluoroalkyl. In an embodiment of this aspect, the metal-ligand complex is in a substantially purified form, such as at least 95% pure, optionally at least 99% pure, optionally at least 99.9% pure, optionally at least 99.99% pure, and optionally at least 99.999% pure.

The metal-ligand complexes disclosed herein are highly tunable. The specific chemistry of these metal-ligand complexes may be adjusted for a particular application or for a particular set of desired parameters. For example, M may be adjusted to deposit a desired solid material. For example, L may be tuned to make the metal-complex more (or less) volatile, as needed for a particular CVD process.

In some embodiments of the metal-ligand complexes disclosed herein, M is selected from the group consisting of Li, Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal. In some embodiments of the metal-ligand complexes disclosed herein, M is selected from the group consisting of Li, Be, Mg, Ca, Sr, Ba, Al, Sc, Ga, Sn, Ti, Zr, Hf, V, Nb, Ta, Cr, Mo, W, Mn, Re, Fe, Ru, Os, Rh, Ir, Ni, Pd, Pt, Cu, Ag, Au, Zn, a lanthanide metal, and an actinide metal. In some embodiments of the metal-ligand complexes disclosed herein, M is selected from the group consisting of Li, Mg, Rh, Ir, Pt, Ru, and Os. In some embodiments of the metal-ligand complexes disclosed herein, M is selected from the group consisting of Pt, Li, Rh, and Ir. In some embodiments of the metal-ligand complexes disclosed herein, M is Pt. In some embodiments of the metal-ligand complexes disclosed herein, a coordination number of M is 4 or 6. In some embodiments of the metal-ligand complexes disclosed herein, a coordination number of M is 4. In some embodiments of the metal-ligand complexes disclosed herein, M has an oxidation number (also referred to as oxidation state) of at least +2.

In some embodiments of the metal-ligand complexes disclosed herein, L is a $\eta^1,\eta^2$-$\beta,\beta$-disubstituted-$\omega$-alkenyl ligand. In some embodiments of the metal-ligand complexes disclosed herein, when x is greater than 1, each L is identical. In some embodiments of the metal-ligand complexes disclosed herein, when x is greater than 1, each L is different from each other L. In some embodiments of the metal-ligand complexes disclosed herein, the total number of carbon atoms in each L excluding $R^1$, $R^2$, $R^3$, $R^4$, $R^5$, $R^6$, $R^7$, $R^8$, and $R^9$ is independently 4 or 5. In some embodiments of the metal-ligand complexes disclosed herein, n is 0 or 1. In some embodiments of the metal-ligand complexes disclosed herein, the total number of carbon atoms in each L excluding functional groups $R^1$, $R^2$, $R^3$, $R^4$, $R^5$, $R^6$, $R^7$, $R^8$, and $R^9$ is 5. In some embodiments of the metal-ligand complexes disclosed herein, n is 1. In some embodiments of the metal-ligand complexes disclosed herein, M is associated with each L via metal-carbon sigma bond and a metal-olefin pi bond. In some embodiments of the metal-ligand complexes disclosed herein, when x is greater than 1, the metal-carbon sigma bonds in said metal-ligand complex are cis with respect to each other. In some embodiments of the metal-ligand complexes disclosed herein, each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, or any combination thereof. In some embodiments of the metal-ligand complexes disclosed herein, each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, or any combination thereof. In some embodiments of the metal-ligand complexes disclosed herein, $R^1$, $R^2$, $R^3$, $R^4$, $R^5$, $R^6$, $R^7$, $R^8$, and $R^9$ are directly or indirectly connected to each other via alkyl groups and/or fluoroalkyl groups. In some embodiments of the metal-ligand complexes disclosed herein, $R^1$, $R^2$, $R^3$, $R^4$, $R^5$, $R^6$, $R^7$, $R^8$, and $R^9$ are indirectly connected to each other via alkyl groups and/or fluoroalkyl groups. In some embodiments of the metal-ligand complexes disclosed herein, L is a bidentate ligand.

In some embodiments of the metal-ligand complexes disclosed herein, E is Si. In some embodiments of the metal-ligand complexes disclosed herein, E is C.

In some embodiments of the metal-ligand complexes disclosed herein, each D independently comprises an ether group ($R^{10}_2O$), an amine group ($R^{10}_3N$), a nitrile group ($R^{10}CN$), an isonitrile group ($R^{10}NC$), a phosphine group ($R^{10}_3P$), a phosphite group (($R^{10}O)_3P$), an arsine group ($R^{10}_3As$), a stibene group ($R^{10}_3Sb$), a sulfide group (CS), a linear, branched, or cyclic monoalkene, a linear, branched, or cyclic diene, a linear, branched, or cyclic triene, bicyclic alkene, bicyclic dienes bicyclic triene, tricyclic diene, tricyclic triene, alkyne, and any combination thereof; wherein each $R^{10}$ is independently selected from the group consisting of a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, and any combination thereof. In some embodiments of the metal-ligand complexes disclosed herein, each D is independently selected from the group consisting of a linear mono-ether, a linear polyether, a cyclic monoether, a cyclic polyether, a monoamine, a linear polyamine, a cyclic monoamines, a cyclic polyamine, and any combination thereof. In some embodiments of the metal-ligand complexes disclosed herein, each D is independently selected from the group consisting of 1,5-cyclooctadiene, bicyclo[2.2.1]hepta-2,5-diene, 1,5-hexadiene, ethylene, dibenzo[a,e]cyclooctene, N,N,N',N'-tetramethylethylenediamine, and acetonitrile.

In some embodiments of the metal-ligand complexes disclosed herein, the metal-ligand complex is a neutral metal-ligand complex. In some embodiments of the metal-ligand complexes disclosed herein is y is 0. In some embodiments of the metal-ligand complexes disclosed herein, the metal-ligand complex is selected from the group consisting of (2,2-dimethylpent-4-en-1-yl)lithium, cis-bis($\eta^1,\eta^2$-2,2-dimethylbut-3-en-1-yl)platinum, cis-bis($\eta^1,\eta^2$-2,2-dimethylpent-4-en-1-yl)platinum, cis-bis($\eta^1$, $\eta^2$-2,2-dimethylhex-5-en-1-yl)platinum, [(1,2,5,6-$\eta$)-1,5-cyclooctadiene]($\eta^1,\eta^2$-2,2-dimethylpent-4-en-1-yl)iridium, [(1,2,5,6-$\eta$)-1,5-cyclooctadiene]($\eta^1$, $\eta^2$-2,2-dimethylpent-4-en-1-yl)rhodium, and [(2,3,5,6-$\eta$)-bicyclo[2.2.1]hepta-2,5-diene]($\eta^1,\eta^2$-2,2-dimethyl-pent-4-en-1-yl)rhodium.

In some embodiments of the metal-ligand complexes disclosed herein, the metal-ligand complex is characterized by the formula FX5:

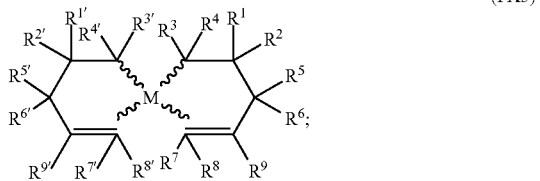

(FX5)

wherein: each $R^1$, $R^{1'}$, $R^2$, and $R^{2'}$ is independently selected from the group consisting of a halide and a substituted or unsubstituted $C_1$-$C_6$ alkyl, $C_3$-$C_{08}$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, $R^9$, $R^{3'}$, $R^{4'}$, $R^{5'}$, $R^{6'}$, $R^{7'}$, $R^{8'}$, and $R^{9'}$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof.

In some embodiments of the metal-ligand complexes disclosed herein, the metal-ligand complex is characterized by the formula FX6:

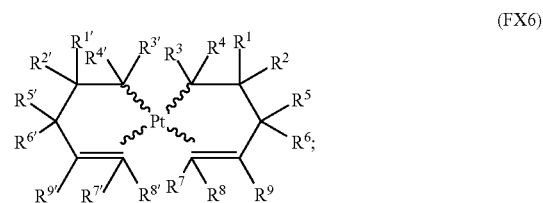

(FX6)

wherein: each $R^1$, $R^{1'}$, $R^2$, and $R^{2'}$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, $R^9$, $R^{3'}$, $R^{4'}$, $R^{5'}$, $R^{6'}$, $R^{7'}$, $R^{8'}$, and $R^{9'}$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof.

In some embodiments of the metal-ligand complexes disclosed herein, the metal-ligand complex is characterized by the formula FX3:

(FX3)

In some embodiments of the metal-ligand complexes disclosed herein, the metal-ligand complex is characterized by the formula FX4:

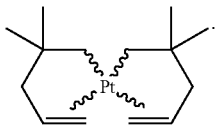
(FX4)

The metal-ligand complexes disclosed herein may be highly stable. For example, the metal-ligand complexes disclosed herein may have a long shelf life (e.g., greater than two weeks at room temperature) if stored under an inert gas atmosphere and/or if stored under an atmosphere comprising oxygen and/or water vapor. In contrast, some convention complexes usable for CVD, particularly for metal such as Pt, have a short shelf life (e.g., less than two weeks at room temperature) and/or a high degree of moisture and oxygen sensitivity.

In some embodiments of the metal-ligand complexes disclosed herein, less than 10 mass % of said metal-ligand complex decomposes after two weeks when stored under at least 1 atm of one or more inert gases at room temperature. In some embodiments of the metal-ligand complexes disclosed herein, less than 5 mass %, less than 1 mass %, less than 0.5 mass %, or less than 0.1 mass % of said metal-ligand complex decomposes after two weeks when stored under at least 1 atm of one or more inert gases at room temperature. In some embodiments of the metal-ligand complexes disclosed herein, less than 10 mass % of said metal-ligand complex decomposes after two weeks of exposure to an oxygen partial pressure of at least 10 mTorr and/or a water vapor partial pressure of at least 10 mTorr at 20° C. In some embodiments of the metal-ligand complexes disclosed herein, less than 20%, less than 5 mass %, less than 1 mass %, less than 0.5 mass %, or less than 0.1 mass % of said metal-ligand complex decomposes after two weeks of exposure to an oxygen partial pressure of at least 10 mTorr and/or a water vapor partial pressure of at least 10 mTorr at 20° C. In some embodiments of the metal-ligand complexes disclosed herein, less than 20%, less than 10 mass %, less than 5 mass %, less than 1 mass %, less than 0.5 mass %, or less than 0.1 mass % of said metal-ligand complex decomposes after two weeks, after 1 month, after 6 months, after 1 year, or after 2 years of exposure to an oxygen partial pressure of at least 10 mTorr and/or a water vapor partial pressure of at least 10 mTorr at 20° C. In some embodiments of the metal-ligand complexes disclosed herein, less than 20%, less than 10 mass %, less than 5 mass %, less than 1 mass %, less than 0.5 mass %, or less than 0.1 mass % of said metal-ligand complex decomposes after two weeks, after 1 month, after 6 months, after 1 year, or after 2 years of exposure to dry air. In some embodiments of the metal-ligand complexes disclosed herein, less than 20%, less than 10 mass %, less than 5 mass %, less than 1 mass %, less than 0.5 mass %, or less than 0.1 mass % of said metal-ligand complex decomposes after two weeks, after 1 month, after 6 months, after 1 year, or after 2 years of exposure to air having a water vapor partial pressure selected from the range of 10 mTorr to 17.5 Torr, 10 mTorr to 10 Torr, 10 mTorr to 5 Torr, 10 mTorr to 1 Torr, or 10 mTorr to 100 mTorr at 20° C. In some embodiments of the metal-ligand complexes disclosed herein, the metal-ligand complex has a thermolysis onset temperature selected from the range of 50° C. to 300° C.; wherein said thermolysis onset temperature is measured using thermogravimetric analysis with a temperature increase rate of 10° C./min and under approximately 1 atm of $N_2$. In some embodiments of the metal-ligand complexes disclosed herein, the metal-ligand complex has a thermolysis onset temperature selected from the range of 50° C. to 300° C.; wherein said thermolysis onset temperature is measured using thermogravimetric analysis under an atmosphere that is substantially 1 atm of $N_2$. In some embodiments of the metal-ligand complexes disclosed herein, the metal-ligand complex has a thermolysis onset temperature selected from the range of 50° C. to 100° C., 50° C. to 200° C., 50° C. to 150° C., 50° C. to 100° C., 80° C. to 100° C., or 80° C. to 150° C.; wherein said thermolysis onset temperature is measured under an atmosphere that is substantially one or more inert gases. In some embodiments of the metal-ligand complexes disclosed herein, the metal-ligand complex has a shelf-life of at least 2 weeks, at least 1 month, at least 6 months, at least 1 year, at least 2 years, at least 5 years, or at least 10 years. In some embodiments of the metal-ligand complexes disclosed herein, said metal-ligand complex does not decompose via beta-hydrogen elimination at NTP.

In some embodiments of the metal-ligand complexes disclosed herein, the metal-ligand complex is a hydrosilylation catalyst or a hydrosilylation catalyst precursor. In some embodiments of the metal-ligand complexes disclosed herein, the metal-ligand complex is a vapor-to-solid precursor.

Provided here are also vapor-to-solid precursors. These vapor-to-solid precursors are useful for deposition of a solid material via a vapor-to-solid process. These vapor-to-solid precursors may comprise any one or more of the metal-ligand complexes disclosed herein. As such, the vapor-to-solid precursors disclosed herein are highly tunable. These vapor-to-solid precursors may be used to deposit a wide variety of solid materials, including solid materials comprising metals that are conventionally difficult or otherwise challenging to deposit via CVD, such as Pt. The vapor-to-solid precursors have a wide range of volatilities, making them suitable for a wide range of deposition processes.

In some aspects, a vapor-to-solid precursor comprises any of the metal-ligand complexes disclosed herein. In some aspects, a vapor-to-solid precursor comprises a metal-ligand complexes according to any one or more embodiments of metal-ligand complexes disclosed herein. In some embodiments of the vapor-to-solid precursors disclosed herein, the metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

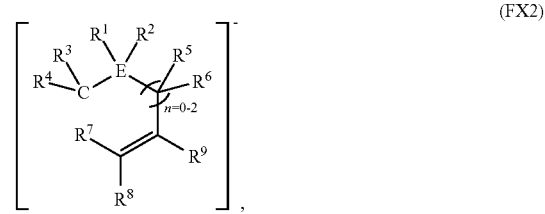
(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of the vapor-to-solid precursors disclosed herein, at least one of $R^1$ and $R^2$ is not a fluoride or a trifluoromethyl. In some embodiments of the vapor-to-solid precursors disclosed herein, at least one of $R^1$ and $R^2$ is not a fluoride or a $C_1$-$C_6$ fluoroalkyl. In some embodiments of the vapor-to-solid precursors disclosed herein, each of both $R^1$ and $R^2$ is not a fluoride or a trifluoromethyl. In some embodiments of the vapor-to-solid precursors disclosed herein, each of both $R^1$ and $R^2$ is not a fluoride or a $C_1$-$C_6$ fluoroalkyl. In some embodiments of the vapor-to-solid precursors disclosed herein, the vapor-to-solid precursor comprises two or more metal-ligand complexes, each of the two or more metal-ligand complexes being a metal-ligand complex according to any one or more of the embodiments of metal-ligand complexes disclosed herein. In an embodiment of this aspect, the metal-ligand complex is in a substantially purified form, such as at least 95% pure, optionally at least 99% pure, optionally at least 99.9% pure, optionally at least 99.99% pure, and optionally at least 99.999% pure.

In some embodiments of the vapor-to-solid precursors disclosed herein, the vapor-to-solid precursor is configured to decompose into solid material on a substrate during a vapor-to-solid process, said solid material comprising M and being a metal, a metal oxide, a metal nitride, a metal carbide, a metal boride, a metal sulfide, a metal phosphide, or a combination thereof. In some embodiments of the vapor-to-solid precursors disclosed herein, said solid material is in the form of a film, a nanostructure, or a combination thereof. In some embodiments of the vapor-to-solid precursors disclosed herein, said vapor-to-solid process is selected from the group consisting of CVD, ALD, and MBE. In some embodiments of the vapor-to-solid precursors disclosed herein, the vapor-to-solid precursor is configured to decompose on a substrate via thermal decomposition, plasma-induced decomposition, radiation-induced decomposition, photolytic decomposition, or any combination thereof. In some embodiments of the vapor-to-solid precursors disclosed herein, said vapor-to-solid precursor is decomposed in the presence of water vapor, oxygen, ozone, carbon dioxide, nitrogen dioxide, or any combination thereof; and wherein the solid material comprises a metal oxide. In some embodiments of the vapor-to-solid precursors disclosed herein, said vapor-to-solid precursor is decomposed in the presence of a gas comprising an amine, ammonia, hydrazine, or any combination thereof; and wherein the solid material comprises a metal nitride.

In some embodiments of the vapor-to-solid precursors disclosed herein, the vapor-to-solid precursor comprises a solvent. In some embodiments of the vapor-to-solid precursors disclosed herein, the solvent comprises a non-coordinating solvent. In some embodiments of the vapor-to-solid precursors disclosed herein, the solvent comprises a coordinating solvent. In some embodiments of the vapor-to-solid precursors disclosed herein, the solvent is a nonaqueous solvent. In some embodiments of the vapor-to-solid precursors disclosed herein, the solvent is an aprotic solvent. In some embodiments of the vapor-to-solid precursors disclosed herein, the said nonaqueous solvent comprises one or more compounds selected from the group consisting of a hydrocarbon solvent, an oxygenated solvent, a halogenated solvent, an alcohol solvent, an amide solvent, an amine solvent, an aromatic solvent, a deuterated solvent, an ester solvent, an ether solvent, a ketone solvent, a nitrosolvent, and any combination thereof. In some embodiments of the vapor-to-solid precursors disclosed herein, the solvent comprises one or more compounds selected from the group consisting of hexane, pentane, nonane, decane, dodecane, tetradecane, octadecane, 1-octadecene, heptane, acetonitrile, acetone, butane, butanone, carbon tetrachloride, chlorobenzene, chloroform, cyclohexane, 1,2-dichloroethane, dichloromethane, propylene carbonate, diethylene glycol, 1,2-dimethylformamide, 1,2-dimethoxyethane, dimethylsulfoxide, 1,4-dioxane, ethanol, ethyl acetate, ethylene glycol, glycerin, hexamethylphosphoramide, hexamethylphosphorous triamide, nitromethane, petroleum ether, propanol, pyridine, triethyl amine, xylene, mesitylene, diethylether, tetrahydrofuran, benzene, toluene, and any combination thereof. In some embodiments of the vapor-to-solid precursors disclosed herein, said vapor-to-solid precursor is decomposed in the presence of hydrogen, methanol, ethanol, hydroquinone, other reductant, or a combination thereof; and wherein said solid material comprises a metal.

Provided herein are also methods for depositing a solid material on a substrate. These methods are highly versatile and may be used to deposit a solid material that is difficult or otherwise challenging to deposit using convention vapor-to-solid depositing processes.

In some aspects, a method for depositing a solid material on a substrate comprises steps of: exposing a receiving surface of said substrate to a vapor of a vapor-to-solid precursor; wherein said vapor-to-solid precursor comprises a metal-ligand complex; and decomposing said metal-ligand complex at said receiving surface of said substrate; thereby forming said solid material, wherein said solid material comprises M. In any of the methods for depositing a solid material, the vapor-to-solid precursor may be any of the vapor-to-solid precursors disclosed herein. In any of the methods for depositing a solid material, the vapor-to-solid precursor may be a vapor-to-solid precursor according to any one or more of the embodiments of vapor-to-solid precursors disclosed herein. In any of the methods for depositing a solid material, the metal-ligand complex may be any of the metal-ligand complexes disclosed herein. In any of the methods for depositing a solid material, the metal-ligand complex may be a metal-ligand complex according to any one or more of the embodiments of metal-ligand complexes disclosed herein. In any of the methods for depositing a solid material, the metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

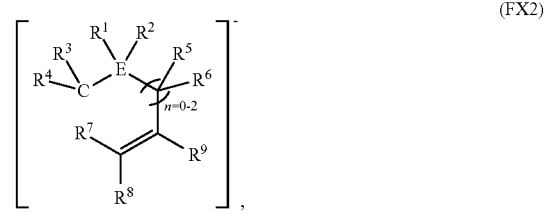

(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of the methods for depositing a solid material, at least one of $R^1$ and $R^2$ is not a fluoride or a trifluoromethyl. In some embodiments of the methods for depositing a solid material, at least one of $R^1$ and $R^2$ is not a fluoride or a $C_1$-$C_6$ fluoroalkyl. In some embodiments of the methods for depositing a solid material, each of both $R^1$ and $R^2$ is not a fluoride or a trifluoromethyl. In some embodiments of the methods for depositing a solid material, each of both $R^1$ and $R^2$ is not a fluoride or a $C_1$-$C_6$ fluoroalkyl. In some embodiments of the methods for depositing a solid material, the vapor-to-solid precursor comprises two or more metal-ligand complexes, each of the two or more metal-ligand complexes being a metal-ligand complex according to any one or more of the embodiments of metal-ligand complexes disclosed herein. In an embodiment of this aspect, the metal-ligand complex is in a substantially purified form, such as at least 95% pure, optionally at least 99% pure, optionally at least 99.9% pure, optionally at least 99.99% pure, and optionally at least 99.999% pure.

In some embodiments of the methods for depositing a solid material, the solid material is in the form of a film, a nanostructure, a microstructure, or a combination thereof. In some embodiments of the methods for depositing a solid material, the solid material is a metal, a metal oxide, a metal nitride, a metal carbide, a metal boride, a metal sulfide, a metal phosphide, or a combination thereof. In some embodiments of the methods for depositing a solid material, the solid material is a metal.

In some embodiments of the methods for depositing a solid material, the step of decomposing comprises decomposition of said metal-ligand complex via thermal decomposition, plasma-induced decomposition, radiation-induced decomposition, photolytic decomposition, or any combination thereof. In some embodiments of the methods for depositing a solid material, the step of decomposing comprises a step of exposing said receiving surface to a plasma. In some embodiments of the methods for depositing a solid material, the step of decomposing comprises a step of exposing said receiving surface to ultraviolet-light radiation. In some embodiments of the methods for depositing a solid material, a temperature of the substrate is selected from the range of 50° C. to 1200° C., 50° C. to 600° C., 50° C. to 300° C., 50° C. to 250° C., 50° C. to 100° C., 100° C. to 250° C., or 100° C. to 500° C. during said step of decomposing.

In some embodiments of the methods for depositing a solid material, the step of exposing further comprises exposing said substrate to a secondary reagent. In some embodiments of the methods for depositing a solid material, the method further comprises a step of decomposing said secondary reagent; wherein said solid material comprises at least a portion of said secondary reagent. In some embodiments of the methods for depositing a solid material, the secondary reagent comprises at least one oxygen atom; and wherein said solid material comprises a metal oxide. In some embodiments of the methods for depositing a solid material, the secondary reagent is water vapor, oxygen, ozone, carbon dioxide, or nitrogen dioxide, or a gas mixture comprising any combination of these. In some embodiments of the methods for depositing a solid material, the secondary reagent comprises at least one nitrogen atom; and wherein said solid material comprises a metal nitride. In some embodiments of the methods for depositing a solid material, the secondary reagent comprises an amine group. In some embodiments of the methods for depositing a solid material, the secondary reagent is hydrazine, ammonia, or a gas mixture comprising a combination of these. In some embodiments of the methods for depositing a solid material, the step of exposing further comprises a step of vaporizing said vapor-to-solid precursor. In some embodiments of the methods for depositing a solid material, the step of vaporizing comprises direct injection, spraying, atomizing, bubbling, evaporating, or any combination thereof. In some embodiments of the methods for depositing a solid material disclosed herein, said vapor-to-solid precursor is decomposed in the presence of hydrogen, methanol, ethanol, hydroquinone, other reductant, or a combination thereof; and wherein said solid material comprises a metal.

In some embodiments of the methods for depositing a solid material, the vapor-to-solid precursor further comprises a carrier gas. In some embodiments of the methods for depositing a solid material, the carrier gas is inert with respect to said metal-ligand complex. In some embodiments of the methods for depositing a solid material, the carrier gas is selected from the group consisting of helium, nitrogen, argon, any combination thereof.

In some embodiments of the methods for depositing a solid material, the method is part of a CVD, ALD, or MBE process for depositing said solid material.

Provided herein are also methods for forming a metal-ligand complex. In any of the methods for forming a metal-ligand complex, the metal-ligand complex may be any of the metal-ligand complexes disclosed herein. In any of the methods for forming a metal-ligand complex, the metal-ligand complex may be a metal-ligand complex according to any one or more of the embodiments of metal-ligand complexes disclosed herein. In any of the methods for forming a metal-ligand complex, the metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

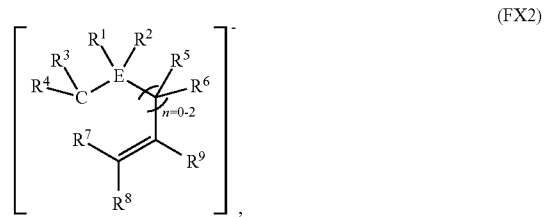

(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of methods for forming a metal-ligand complex, at least one of $R^1$ and $R^2$ is not a fluoride or a trifluoromethyl. In some embodiments of the methods for forming a metal-ligand complex, at least one of $R^1$ and $R^2$ is not a fluoride or a $C_1$-$C_6$ fluoroalkyl. In some embodiments of the methods for forming a metal-ligand complex, each of both $R^1$ and $R^2$ is not a fluoride or a trifluoromethyl. In some embodiments of the methods for forming a metal-ligand complex, each of both $R^1$ and $R^2$ is not a fluoride or a $C_1$-$C_6$ fluoroalkyl. In some embodiments of the methods for forming a metal-ligand complex, the method comprises combining a starting compound and a Grignard reagent or an organolithium. In some embodiments of the methods for forming a metal-ligand complex, the starting compound comprises the metal M. In some embodiments of the methods for forming a metal-ligand complex, the starting compound is a metal halide or a Lewis base adduct of a metal halide, said metal halide comprising the metal M. In some embodiments of the methods for forming a metal-ligand complex, the Grignard reagent comprises the ligand L. In some embodiments of the methods for forming a metal-ligand complex, the organolithium reagent comprises the ligand L. In some embodiments of the methods for forming a metal-ligand complex, the method further comprises extracting and/or subliming the one or more products of said step of combining.

Also provided herein are methods for catalytic hydrosilylation of a starting compound. These methods are highly versatile. These hydrosilylation methods may further provide greater opportunities for performing hydrosilylation reactions under a wider variety of conditions, including outside of a laboratory setting. These methods may include the ability to activate, or trigger, the hydrosilylation reaction(s) such that the process may be performed only when desired.

In some aspects, a method for catalytic hydrosilylation of a starting compound, comprises steps of: hydrosilylating said starting compound in the presence of a hydrosilylation catalyst; wherein said hydrosilylation catalyst comprises a metal-ligand complex or wherein said hydrosilylation catalyst is formed by activation of a hydrosilylation precatalyst that comprises said metal-ligand complex. In any of the methods for catalytic hydrosilylation of a starting compound, the metal-ligand complex may be any of the metal-ligand complexes disclosed herein. In any of the methods for catalytic hydrosilylation of a starting compound, the metal-ligand complex may be a metal-ligand complex according to any one or more of the embodiments of metal-ligand complexes disclosed herein. In any of the methods for catalytic hydrosilylation of a starting compound, the metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

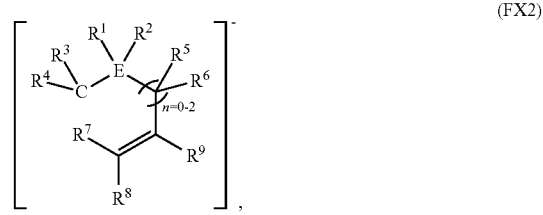

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of the methods for depositing a solid material, at least one of $R^1$ and $R^2$ is not a fluoride or a trifluoromethyl. In some embodiments of the methods for depositing a solid material, at least one of $R^1$ and $R^2$ is not a fluoride or a $C_1$-$C_6$ fluoroalkyl. In some embodiments of the methods for catalytic hydrosilylation of a starting compound, each of both $R^1$ and $R^2$ is not a fluoride or a trifluoromethyl. In some embodiments of the methods for catalytic hydrosilylation of a starting compound, each of both $R^1$ and $R^2$ is not a fluoride or a $C_1$-$C_6$ fluoroalkyl. In some embodiments of the methods for catalytic hydrosilylation of a starting compound, the hydrosilylation catalyst or hydrosilylation precatalyst may comprise two or more metal-ligand complexes, each of the two or more metal-ligand complexes being a metal-ligand complex according to any one or more of the embodiments of metal-ligand complexes disclosed herein. In some embodiments of the methods for catalytic hydrosilylation of a starting compound, the method comprises a step of activating said hydrosilylation precatalyst. In some embodiments of the methods for catalytic hydrosilylation of a starting compound, the step of activating comprises exposing said hydrosilylation precatalyst to at least one of ultraviolet-light radiation and a co-reactant. In an embodiment of this aspect, the metal-ligand complex is in a substantially purified form, such as at least 95% pure, optionally at least 99% pure, optionally at least 99.9% pure, optionally at least 99.99% pure, and optionally at least 99.999% pure. In an embodiment, n is 0 or an integer selected from the range of 1 to 6. In an embodiment, n is 0 or an integer selected from the range of 1 to 5. In an embodiment, n is 0 or an integer selected from the range of 1 to 3.

In an embodiment, a metal-ligand complex characterized by the formula FX1 is in a substantially purified form, such as at least 95% pure, optionally at least 99% pure, optionally at least 99.9% pure, optionally at least 99.99% pure, and optionally at least 99.999% pure. In an embodiment, a metal-ligand complex comprising one or more ligands characterized by formula FX2, FX2a, FX2b, FX2c, FX3, FX4, FX5, FX6, or FX7 is in a substantially purified form, such as at least 95% pure, optionally at least 99% pure, optionally at least 99.9% pure, optionally at least 99.99% pure, and optionally at least 99.999% pure. In an embodiment, a vapor-to-solid precursor comprising a metal-ligand complex characterized by formula FX1 is in a substantially purified form, such as at least 95% pure, optionally at least 99% pure, optionally at least 99.9% pure, optionally at least 99.99% pure, and optionally at least 99.999% pure. In an embodiment, a vapor-to-solid precursor having a metal-ligand complex that comprises one or more ligands characterized by formula FX2, FX2a, FX2b, FX2c, FX3, FX4, FX5, FX6, or FX7 is in a substantially purified form, such as at least 95% pure, optionally at least 99% pure, optionally at least 99.9% pure, optionally at least 99.99% pure, and optionally at least 99.999% pure.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

The features, objects and advantages other than those set forth above will become more readily apparent when consideration is given to the detailed description below. Such detailed description makes reference to the following drawings, wherein:

FIG. 9A is a schematic of an exemplary vapor-to-solid process comprising a vapor-to-solid precursor to deposit a solid material onto a heated substrate. Other vapor-to-solid processes may also be useful with the complexes, precursors, catalysts, and methods described herein, including processes that do not require or comprise a vaporizer, such as an atomizer, to deliver a vapor-to-solid precursor to the substrate. FIG. 9B is an illustration of a solid material deposition mechanism during CVD.

STATEMENTS REGARDING CHEMICAL COMPOUNDS AND NOMENCLATURE

Figure 1:
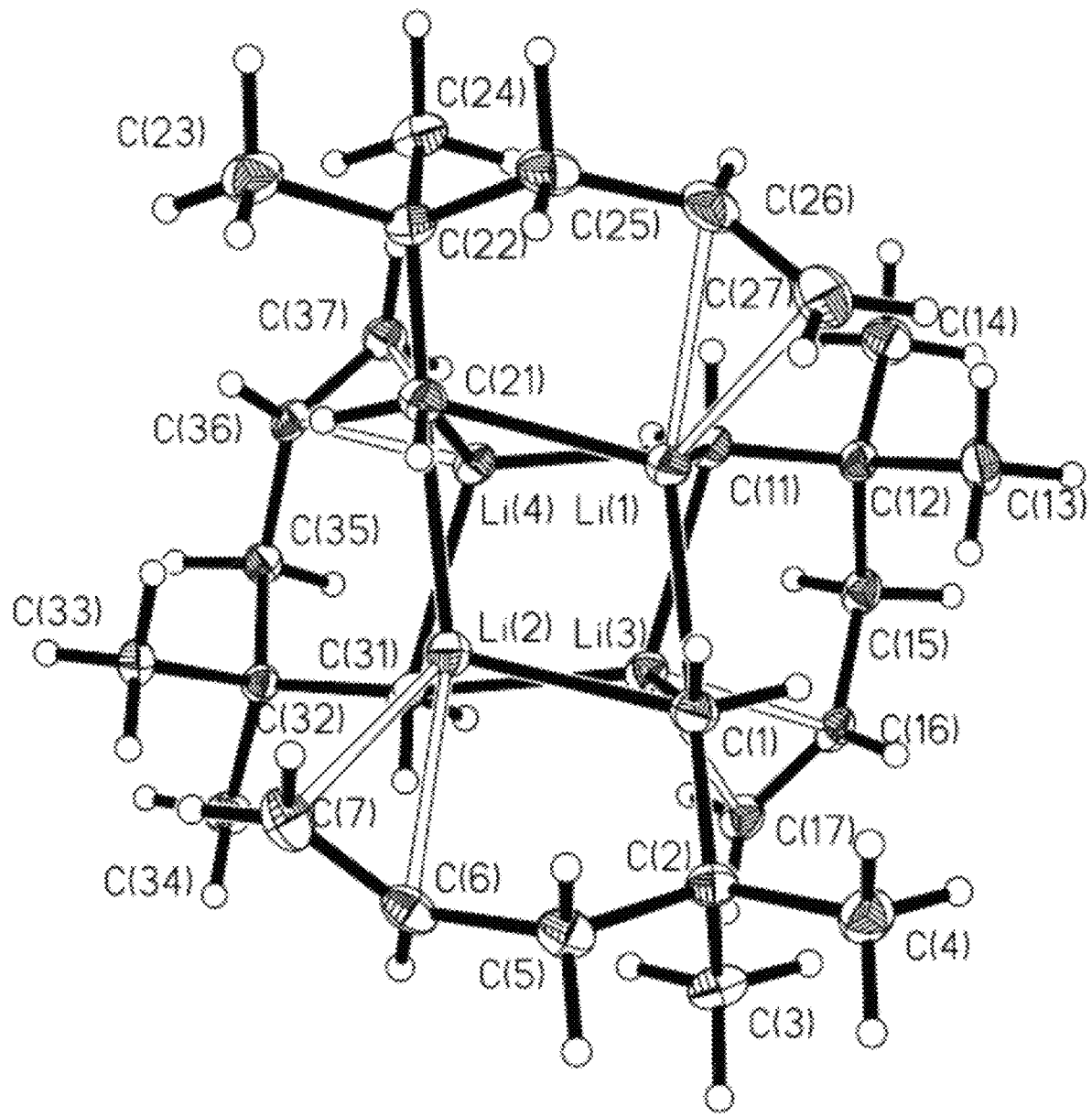
FIG. 1. Molecular structure of (2,2-dimethylpent-4-en-1-yl)lithium. Ellipsoids are drawn at the 35% probability level.

In general, the terms and phrases used herein have their art-recognized meaning, which can be found by reference to standard texts, journal references and contexts known to those skilled in the art. The following definitions are provided to clarify their specific use in the context of the invention.

The term "ligand", as used herein, refers to a molecule or chemical group that is associated with a metal atom or metal ions. The term "associated" refers to a covalent bond, an ionic bond, a coordination bond, or any combination of these. In some embodiments, a ligand associated with a metal atom or metal ion refers to a ligand that is coordinated with (i.e., in a coordination bond with) the metal atom or metal ion. In some embodiments, a ligand associated with a metal atom or metal ion refers to a ligand that is ionically bonded to a metal atom or metal ion. In an example, the cyano groups in ferricyanide are directly associated with, or directly coordinated with, the central iron ion. A ligand may be unidentate or polydentate. Denticity refers to the number of coordination sites occupied by the ligand when associated to a metal atom or metal ion. Compounds, formulations, and methods of the invention may include, for example, unidentate, bidentate, tridentate, tetradentate or higher denticity ligands. An anionic ligand is a ligand having a negative charge. A cationic ligand is a ligand having a positive charge. A mono-anionic ligand is a ligand whose charge is −1. For example, the ligand 2,2-dimethylpent-4-en-1-yl (e.g., as in the complex cis-bis($\eta^1,\eta^2$-2,2-dimethylpent-4-en-1-yl)platinum) is a mono-anionic ligand. Each 2,2-dimethylpent-4-en-1-yl ligand in the complex cis-bis($\eta^1,\eta^2$-2,2-dimethylpent-4-en-1-yl)platinum is bidentate, where each 2,2-dimethylpent-4-en-1-yl ligand is independently coordinated to the Pt metal center at two coordination sites via a Pt—C sigma bond and a Pt-olefin pi bond. The term "charge" refers to a formal charge, a net or total charge of a chemical species. A ligand may be neutral, anionic, or cationic. A "neutral coordinating ligand" is a neutral ligand, whose formal charge is 0, that is associated with a metal atom or ion of the metal-ligand complex via a coordination bond.

The symbol eta or "η" refers to hapticity of a ligand. Hapticity refers to the coordination of a ligand to a metal center via an uninterrupted and contiguous series of atoms. The superscript on the symbol η refers to the number of uninterrupted and contiguous atoms, in the ligand, that are involved in coordination to the metal center, of the metal-ligand complex. For example, a ferrocene metal-ligand complex contains two $\eta^5$-cyclopentadienyl ligands, each ligand coordinated to the metal (Fe) center via 5 uninterrupted and contiguous atoms. A ligand having non-contiguous atoms coordinated to the metal center may be represented with multiple hapticities, or multiple η symbols. For example, the complex cis-bis($\eta^1,\eta^2$-2,2-dimethylpent-4-en-1-yl)platinum has two $\eta^1,\eta^2$-2,2-dimethylpent-4-en-1-yl ligands. The ligand $\eta^1,\eta^2$-2,2-dimethylpent-4-en-1-yl has a total of 3 atoms involved in coordination to the metal center, where two coordinating atoms (corresponding to the Pt-olefin pi bond) are contiguous and a third coordinating atom (corresponding to the Pt—C sigma bond) is not contiguous with respect to the other two coordinating atoms; in other words, two coordinating atoms are separated by at least one non-coordinating atom from the third coordinating atom.

Compounds and formulations, including complexes, precursors, and catalysts, and methods of the invention may include ligands that are Lewis acidic ligands or Lewis basic ligands in a metal-ligand complex. A "Lewis acid" refers to a chemical species, such as an atom, ion, functional group, or molecule, which contains an empty electron orbital which is capable of accepting an electron pair from a Lewis base. A "Lewis base" refers to a chemical species which contains a filled electron orbital containing an electron pair which is capable of forming a dative bond with a Lewis acid. As an illustrative example, boron trifluoride ($BF_3$) and certain transition metal cations, such as $Pt^{2+}$, may be Lewis acids. As an illustrative example, certain amines, such as $NH_3$, and halides, such as $Cl^-$, may be Lewis bases. The term "Lewis acidic" refers to a chemical species at least a portion of which is a Lewis acid. For example, the molecule $BF_3$ is Lewis acidic because the B in $BF_3$ is a Lewis acid. The term "Lewis basic" refers to a chemical species at least a portion of which is a Lewis base. For example, $NH_3$ may be Lewis basic because the N in $NH_3$ is a Lewis base.

The term "metal-ligand complex" refers to a chemical species that comprises a metal, which is a metal atom or a metal ion, where the metal is associated with at least one ligand. The metal atom or metal ion of the metal-ligand complex may be referred to as the "metal center" of the metal-ligand complex. A metal-ligand complex may also be referred to as a metal-coordination complex or a "complex," as used herein. A metal-ligand complex may be neutral with a formal charge of 0. A metal-ligand complex may have a positive or negative formal charge. An exemplary metal-ligand complex is cis-bis($\eta^1,\eta^2$-2,2-dimethylpent-4-en-1-yl)platinum, which is neutral (formal charge is 0) and which has an platinum ion as the central metal and two monoanionic tridentate ligands (2,2-dimethylpent-4-en-1-yl). A metal-ligand complex may have one, two, three, four, or more ligands. A metal-ligand complex may have at least one charged ligand (ligand having non-zero formal charge) and at least one neutral ligand. In some embodiments, two or more ligands of a single metal-ligand complex may be associated with each other.

A "vapor-to-solid precursor" is, or comprises, a molecule that may undergo a vapor-to-solid decomposition reaction. In some embodiments, the term "vapor" refers to a gas, a vapor, and/or an aerosol. In some embodiments, the term "vapor" refers a gas-phase material (i.e., a gas or vapor) or a material otherwise dispersed in a vapor space (e.g., aerosol; e.g., liquid droplets sprayed or injected into a vapor space). The term "vapor space" refers to a volume that may be occupied by a gas, vapor, or aerosol. A vapor-to-solid decomposition refers to a reaction wherein a molecule or material in vapor-state forms one or more solid-state decomposition products. A vapor-to-solid decomposition reaction is for example, but not limited to, a disproportionation reaction. A vapor-to-solid decomposition reaction may result in at least one vapor-state product and at least one solid-state product. The term "vapor-state" refers to a molecule whose physical state of matter is as a gas, vapor, or aerosol. In some embodiments, the term "vapor-state" or "vapor-phase" refers to a molecule whose physical state is as a gas or vapor. The term "solid-state" or "solid-phase" refers to an atom, ion, compound, molecule, or combination of these, whose physical state of matter is as a solid. The solid-phase decomposition product of a vapor-to-solid precursor may contribute to formation of, i.e., is a substituent of, a solid material such as a film or nanostructure. A vapor-to-solid precursor may be suitable for chemical vapor deposition (CVD), atomic layer deposition (ALD), molecular beam epitaxy (MBE), physical vapor deposition (PVD), or any combination of these deposition processes. A vapor-to-solid precursor may be a chemical vapor deposition (CVD) precursor and/or an atomic layer deposition (ALD) precursor. CVD and ALD are exemplary vapor-to-solid deposition processes for deposition of a solid material from a vapor-phase precursor. Exemplary CVD processes include, but are not limited to, metal-organic CVD (MOCVD), plasma-enhanced CVD (PECVD), microwave plasma-assisted CVD (MWCVD or MPCVD), hot filament CVD (HFCVD), photo-initiated CVD (PICVD), laser CVD (LCVD), vapor-phase epitaxy (VPE), and atomic layer deposition (ALD). More than one vapor-to-solid precursor may be used, for example to deposit a solid material that comprises more than one type of metal. Decomposition of the vapor-to-solid precursor may involve reaction of the precursor with the substrate, or receiving surface thereof. The substrate may be exposed simultaneously and/or sequentially to a plurality of vapor-to-solid precursors to deposit a solid material. The term "vaporizer" refers to an element that may form a vapor of a precursor material, including, but not limited to, a bubbler, an atomizer, and an evaporator.

A "solid material" may be a film, a nanostructure, or a microstructure. A film may be a thin film. A film is optionally conformal. A film is optionally substantially continuous or discontinuous. A film is optionally substantially free of pinholes. In some embodiments, a film has a thickness selected from the range of 1 nm to 10 mm, 1 nm to 1 mm, 1 nm to 500 µm, 1 nm to 100 µm, 1 nm to 10 µm, 1 nm to 1 µm, 100 nm to 100 µm, or 1 µm to 100 µm. A nanostructure is a solid feature having at least one physical size dimension in the range of 1 nm to less than 1 µm. Relevant examples of a physical size dimension include: length, width, diameter, radius, volume-based diameter $$\left(2\sqrt[3]{\frac{3V}{4\pi}}\right),$$

area-based diameter $$\left(\sqrt[2]{\frac{4A}{\pi}}\right)r,$$

weight-based diameter $$\left(2\sqrt[3]{\frac{3W}{4\pi dg}}\right),$$

and hydrodynamic diameter; where V is nanostructure volume, A is nanostructure surface area, W is nanostructure weight, d is nanostructure density, and g is the gravitational constant. The nanostructure volume, area, weight, and area each may be an average property reflective of the nanostructure size distribution. Exemplary nanostructures include, but are not limited to, islands, pyramids, nanoparticles, nanotubes, and nanowires. A microstructure is a solid feature having whose physical size dimensions are in the range of 1 μm to 1000 μm. In some embodiments, a microstructure is a solid feature having whose physical size dimensions are in the range of 1 μm to 100 μm. Exemplary microstructures include, but are not limited to, islands. The solid material may be substantially amorphous or substantially crystalline. The solid material may have a combination of crystalline and amorphous regions. The solid material may be substantially compositionally homogenous. The solid material may be substantially compositionally heterogenous. The solid material may have regions that are substantially compositionally homogenous and regions that are substantially compositionally heterogenous. A solid material may be a metal, a metal oxide, a metal nitride, a metal carbide, a metal boride, a metal sulfide, a metal phosphide, or a combination of these. A solid material may be an alloy, such as a metal alloy. A solid material deposited via decomposition of a metal-ligand complex comprises the metal atom or metal ion of the metal-ligand complex.

The term "thermolysis onset temperature" refers to a characteristic decomposition temperature at which a molecule (e.g., metal-ligand complex) thermally decomposes. The thermolysis temperature may be measured using thermogravimetric analysis (TGA), for example. In some embodiments, the characteristic decomposition temperature is the temperature corresponding to an inflection point in a plot of sample mass vs. temperature. An inflection point refers to a point on a continuously differentiable plane curve at which the curve crosses its tangent, that is, the curve changes from being concave (concave downward) to convex (concave upward), or vice versa. In some embodiments, a curve of sample mass vs. temperature (e.g., a TGA curve) is first smoothed before determining an inflection point. A curve of sample mass vs. temperature may have more than one inflection point. For example, more than one inflection point corresponds to more than one decomposition reactions, each having its own characteristic decomposition temperature. In some embodiments, the thermolysis onset temperature of a molecule is the lowest characteristic decomposition temperature of the molecule, corresponding to the first decomposition reaction as temperature is increased from a starting temperature (e.g., room temperature or 0° C.).

The term "thermally stable" refers to a property of a material such that the material is capable of not decomposing in response to a given temperature. The term "thermally stable" may refer to a property of a material such that the material is capable of not decomposing at a significant rate in response to a given temperature. A significant rate of decomposition may, for example, refer to a decomposition of at least 0.1% of the starting material mass per hour, at least 1% of the starting material mass per hour, or at least 10% of the starting material mass per hour; where decomposition may refer to change of the starting material into one or more other materials (e.g., a material decomposing into decomposition product(s); e.g., a metal-ligand complex decomposing into solid and vapor products). In an example, a material that is thermally stable at 100° C. is a material that does not thermally decompose at a significant rate when exposed to temperatures up to 100° C.

The term "normal temperature and pressure" or "NTP" refers to standard conditions defined as a temperature of 20° C. and an absolute pressure of 1 atm (14.696 psi, 101.325 kPa).

The term room temperature refers to a temperature of 20 OC.

The terms "hydrosilylation" may also be conventionally referred to as hydrosilation, catalytic hydrosilation, or catalyst hydrosilylation. Generally, hydrosilylation refers to the process, reaction(s), or mechanism(s) by which Si— and H— bonds are added to a compound. Typically, hydrosilylation involves saturation of an unsaturated bond (e.g., double bond to single bond, triple bond to double bond, etc.) in a starting compound via addition of Si— and H— bonds across the respective bond of the starting material. Hydrosilylation may be described as adding $R_3Si$— (a silyl group) and H— (a hydride group) across an unsaturated bond thereby saturating said bond in a starting compound. Hydrosilylation is typically a catalytic process which requires, or is kinetically accelerated by, performing the reaction in the presence of a hydrosilylation catalyst. Optionally, a hydrosilylation precatalyst is used whereby activating, or triggering, the hydrosilylation precatalyst transforms the hydrosilylation precatalyst into a hydrosilylation catalyst. The hydrosilylation catalyst may then proceed to catalyze the hydrosilylation reaction. As such, the hydrosilylation reaction may be activated, or triggered, on demand. As used herein, activating and triggering a hydrosilylation reaction may be used interchangeably. For example, activation may involve exposure of the hydrosilylation precatalyst to ultraviolet-light radiation and/or a co-reactant. A co-reactant may be a reagent that reduced or oxidizes the hydrosilylation precatalyst, optionally in the presence of ultraviolet-light radiation, thereby forming a hydrosilylation precatalyst as the product. In some embodiments, activation of a hydrosilylation precatalyst may occur spontaneously.

As used herein, "silyl" refers to the functional group $R_3Si$—, where each R is independently a hydrogen, a halide (or, halo group), or a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof.

As used herein, "fluoroalkyl" refers to an alkyl group that is substituted with one or more fluoride groups. A fluoroalkyl group may be an alkyl group having one, two, or three hydrogens replaced with a fluoride. Trifluoromethyl ($CF_3$—) is an exemplary fluoroalkyl group. Fluoroalkyl groups are examples of haloalkyl groups.

The terms "non-aqueous solvent", "nonaqueous solvent", and "organic solvent" may be used interchangeably and refer to a non-water liquid in which may dissolve a solute, such as a metal-ligand complex. In some embodiments, the nonaqueous solvents is substantially nonpolar. In some embodiments, the nonaqueous solvent is an aprotic solvent. An aprotic solvent refers to a compound that donate a hydrogen (e.g., lacking a C—H or N—H bond, or lacking a labile H⁺). The nonaqueous solvent may be a polar aprotic solvent. The non-aqueous solvent may include small amounts of water, such that the water is a solute or impurity dissolved in the nonaqueous solvent. The non-aqueous solvent may include small amounts of water but such that the predominant phase of the solution is the non-water liquid and the solute(s) remains substantially dissolved in the non-water (nonaqueous) phase. Exemplary non-aqueous solvents include, but are not limited to, hexane, pentane, nonane, decane, dodecane, tetradecane, octadecane, 1-octadecene, heptane, acetonitrile, acetone, butane, butanone, carbon tetrachloride, chlorobenzene, chloroform, cyclohexane, 1,2-dichloroethane, dichloromethane, diethylene glycol, 1,2-dimethylformamide, 1,2-dimethoxyethane, propylene carbonate, dimethylsulfoxide, 1,4-dioxane, ethanol, ethyl acetate, ethylene glycol, glycerin, hexamethylphosphoramide, hexamethylphosphorous triamide, nitromethane, petroleum ether, propanol, pyridine, triethyl amine, xylene, mesitylene, diethylether, tetrahydrofuran, benzene, toluene, and any mixture of two or more of these.

"Molecule" refers to a collection of chemically bound atoms with a characteristic composition. As used herein, a molecule can be neutral or can be electrically charged, such as singly charged and multiply charged ions.

"Substrate" refers to a material, layer or other structure having a surface, such as a receiving surface, that is capable of supporting a deposited material, such as a thin film structure or layer. Substrates may optionally have a receiving surface. The receiving surface may optionally have one or more features, such as nanosized or microsized recessed features including high aspect ratio features.

The term "shelf life" refers to a time duration for storage of a metal-ligand complex before a predetermined amount of the metal-ligand complex decomposes into other molecule(s) or compound(s). The predetermined amount may be 10 mol % or more, 20 mol % or more, 30 mol % or more, 40 mol % or more, 50 mol % or more, 60 mol % or more, or 70 mass % or more. The predetermined amount may be 10 mass % or more, 20 mass % or more, 30 mass % or more, 40 mass % or more, 50 mass % or more, 60 mass % or more, or 70 mass % or more. During the time duration of storage, the storage conditions (e.g., temperature, pressure, and atmosphere) may remain substantially unchanged. For example, the metal-ligand complex may be stored in a container held at room temperature, the container having a total pressure of 1 atm or a partial pressure of an inert gas of 1 atm. The atmosphere in the container may be a substantially a mixture of the metal-ligand complex and an inert gas. For example, the shelf life of a metal-ligand complex may be such that less than 10 mass % of said metal-ligand complex decomposes after two weeks when stored under approximately 1 atm of one or more inert gases at room temperature.

The term "inert gas" refers to a gas that is does not chemically and adversely react with a metal-ligand complex. For example, inert gases may include, but are not limited to, helium, argon, nitrogen, and combinations of these.

The term "substantially" refers to a property that is within 10%, within 5%, within 1%, or is equivalent to a reference property. The term "substantially equal", "substantially equivalent", or "substantially unchanged", when used in conjunction with a reference value describing a property or condition, refers to a value that is within 10%, within 5%, within 1%, or is equivalent to the provided reference value. For example, a temperature is substantially unchanged if it remains within 10%, within 5%, within 1%, or equal to a reference value, where the reference value may be a starting value. The term "substantially greater", when used in conjunction with a reference value describing a property or condition, refers to a value that is at least 2%, at least 5%, or at least 10% greater than the provided reference value. The term "substantially less", when used in conjunction with a reference value describing a property or condition, refers to a value that is at least 2%, at least 5%, or at least 10% less than the provided reference value.

As used herein, the term "group" may refer to a functional group of a chemical compound. Groups of the present compounds refer to an atom or a collection of atoms that are a part of the compound. Groups of the present invention may be attached to other atoms of the compound via one or more covalent bonds. Groups may also be characterized with respect to their valence state. The present invention may include groups characterized as monovalent, divalent, trivalent, etc. valence states.

As used herein, the term "substituted" refers to a compound wherein a hydrogen is replaced by another functional group, including, but not limited to: a halogen or halide, an alkyl, a cycloalkyl, an aryl, a heteroaryl, an acyl, an alkoxy, an alkenyl, an alkynyl, an alkylaryl, an arylene, a heteroarylene, an alkenylene, a cycloalkenylene, an alkynylene, a hydroxyl (—OH), a carbonyl (RCOR'), a sulfide (e.g., RSR'), a phosphate (ROP(=O)(OH)$_2$), an azo (RNNR'), a cyanate (ROCN), an amine (e.g., primary, secondary, or tertiary), an imine (RC(=NH)R'), a nitrile (RCN), a pyridinyl (or pyridyl), a diamine, a triamine, an azide, a diimine, a triimine, an amide, a diimide, or an ether (ROR'); where each of R and R' is independently a hydrogen or a substituted or unsubstituted alkyl group, aryl group, alkenyl group, or a combination of these. Optional substituent functional groups are also described below. In some embodiments, the term substituted refers to a compound wherein more than one hydrogen is replaced by another functional group, such as a halogen group.

As is customary and well known in the art, hydrogen atoms in chemical formulas are not always explicitly shown, for example, hydrogen atoms bonded to the carbon atoms of aromatic, heteroaromatic, and alicyclic rings are not always explicitly shown in chemical formulas. The structures provided herein, for example in the context of the description of chemical formulas and schematics and structures in the drawings, are intended to convey to one of reasonable skill in the art the chemical composition of compounds of the methods and compositions of the invention, and as will be understood by one of skill in the art, the structures provided do not indicate the specific positions and/or orientations of atoms and the corresponding bond angles between atoms of these compounds.

As used herein, the terms "alkylene" and "alkylene group" are used synonymously and refer to a divalent group derived from an alkyl group as defined herein. The invention may include compounds having one or more alkylene groups. Alkylene groups in some compounds function as linking and/or spacer groups. Compounds of the invention may have substituted and/or unsubstituted $C_1$-$C_{20}$ alkylene, $C_1$-$C_{10}$ alkylene and $C_1$-$C_5$ alkylene groups, for example, as one or more linking groups (e.g. $L^1$-$L^6$).

As used herein, the terms "cycloalkylene" and "cycloalkylene group" are used synonymously and refer to a divalent group derived from a cycloalkyl group as defined herein. The invention may include compounds having one or more cycloalkylene groups. Cycloalkyl groups in some compounds function as linking and/or spacer groups. Compounds of the invention may have substituted and/or unsubstituted $C_3$-$C_{20}$ cycloalkylene, $C_3$-$C_{10}$ cycloalkylene and $C_3$-$C_5$ cycloalkylene groups, for example, as one or more linking groups (e.g. $L^1$-$L^6$).

As used herein, the terms "arylene" and "arylene group" are used synonymously and refer to a divalent group derived from an aryl group as defined herein. The invention may include compounds having one or more arylene groups. In some embodiments, an arylene is a divalent group derived from an aryl group by removal of hydrogen atoms from two carbon atoms of an aromatic ring of the aryl group. Arylene groups in some compounds function as linking and/or spacer groups. Arylene groups in some compounds function as chromophore, fluorophore, aromatic antenna, dye and/or imaging groups. Compounds of the invention may include substituted and/or unsubstituted $C_3$-$C_{30}$ arylene, $C_3$-$C_{20}$ arylene, $C_3$-$C_{10}$ arylene and $C_1$-$C_5$ arylene groups, for example, as one or more linking groups (e.g. $L^1$-$L^6$).

As used herein, the terms "heteroarylene" and "heteroarylene group" are used synonymously and refer to a divalent group derived from a heteroaryl group as defined herein. The invention may include compounds having one or more heteroarylene groups. In some embodiments, a heteroarylene is a divalent group derived from a heteroaryl group by removal of hydrogen atoms from two intra-ring carbon atoms or intra-ring nitrogen atoms of a heteroaromatic or aromatic ring of the heteroaryl group. Heteroarylene groups in some compounds function as linking and/or spacer groups. Heteroarylene groups in some compounds function as chromophore, aromatic antenna, fluorophore, dye and/or imaging groups. Compounds of the invention may include substituted and/or unsubstituted $C_3$-$C_{30}$ heteroarylene, $C_3$-$C_{20}$ heteroarylene, $C_1$-$C_{10}$ heteroarylene and $C_3$-$C_5$ heteroarylene groups, for example, as one or more linking groups (e.g. $L^1$-$L^6$).

As used herein, the terms "alkenylene" and "alkenylene group" are used synonymously and refer to a divalent group derived from an alkenyl group as defined herein. The invention may include compounds having one or more alkenylene groups. Alkenylene groups in some compounds function as linking and/or spacer groups. Compounds of the invention may include substituted and/or unsubstituted $C_2$-$C_{20}$ alkenylene, $C_2$-$C_{10}$ alkenylene and $C_2$-$C_5$ alkenylene groups, for example, as one or more linking groups (e.g. $L^1$-$L^6$).

As used herein, the terms "cycloalkenylene" and "cycloalkenylene group" are used synonymously and refer to a divalent group derived from a cycloalkenyl group as defined herein. The invention may include compounds having one or more cycloalkenylene groups. Cycloalkenylene groups in some compounds function as linking and/or spacer groups. Compounds of the invention may include substituted and/or unsubstituted $C_3$-$C_{20}$ cycloalkenylene, $C_3$-$C_{10}$ cycloalkenylene and $C_3$-$C_5$ cycloalkenylene groups, for example, as one or more linking groups (e.g. $L^1$-$L^6$).

As used herein, the terms "alkynylene" and "alkynylene group" are used synonymously and refer to a divalent group derived from an alkynyl group as defined herein. The invention may include compounds having one or more alkynylene groups. Alkynylene groups in some compounds function as linking and/or spacer groups. Compounds of the invention may include substituted and/or unsubstituted $C_2$-$C_{20}$ alkynylene, $C_2$-$C_{10}$ alkynylene and $C_2$-$C_5$ alkynylene groups, for example, as one or more linking groups (e.g. $L^1$-$L^6$).

As used herein, the term "halo" refers to a halo group such as a fluoro (—F), chloro (—Cl), bromo (—Br), iodo (—I) or astato (—At). A "haloalkyl" refers to an alkyl group having a halo group, or a halogen-substituted alkyl group. Exemplary haloalkyl groups include, but are not limited to, trihalomethyl groups such as trifluoromethyl groups. The terms "halogen" and "halide" may be used interchangeably when referring to a halo group.

The term "heterocyclic" refers to ring structures containing at least one other kind of atom, in addition to carbon, in the ring. Examples of such heteroatoms include nitrogen, oxygen and sulfur. Heterocyclic rings include heterocyclic alicyclic rings and heterocyclic aromatic rings. Examples of heterocyclic rings include, but are not limited to, pyrrolidinyl, piperidyl, imidazolidinyl, tetrahydrofuryl, tetrahydrothienyl, furyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, triazolyl and tetrazolyl groups. Atoms of heterocyclic rings can be bonded to a wide range of other atoms and functional groups, for example, provided as substituents.

The term "carbocyclic" refers to ring structures containing only carbon atoms in the ring. Carbon atoms of carbocyclic rings can be bonded to a wide range of other atoms and functional groups, for example, provided as substituents.

The term "alicyclic ring" refers to a ring, or plurality of fused rings, that is not an aromatic ring. Alicyclic rings include both carbocyclic and heterocyclic rings.

The term "aromatic ring" refers to a ring, or a plurality of fused rings, that includes at least one aromatic ring group. The term aromatic ring includes aromatic rings comprising carbon, hydrogen and heteroatoms. Aromatic ring includes carbocyclic and heterocyclic aromatic rings. Aromatic rings are components of aryl groups.

The term "fused ring" or "fused ring structure" refers to a plurality of alicyclic and/or aromatic rings provided in a fused ring configuration, such as fused rings that share at least two intra ring carbon atoms and/or heteroatoms.

As used herein, the term "alkoxyalkyl" refers to a substituent of the formula alkyl-O-alkyl.

As used herein, the term "polyhydroxyalkyl" refers to a substituent having from 2 to 12 carbon atoms and from 2 to 5 hydroxyl groups, such as the 2,3-dihydroxypropyl, 2,3,4-trihydroxybutyl or 2,3,4,5-tetrahydroxypentyl residue.

As used herein, the term "polyalkoxyalkyl" refers to a substituent of the formula alkyl-(alkoxy)$_n$-alkoxy wherein n is an integer from 1 to 10, preferably 1 to 4, and more preferably for some embodiments 1 to 3.

Amino acids include glycine, alanine, valine, leucine, isoleucine, methionine, proline, phenylalanine, tryptophan, asparagine, glutamine, glycine, serine, threonine, serine, rhreonine, asparagine, glutamine, tyrosine, cysteine, lysine, arginine, histidine, aspartic acid and glutamic acid. Peptides are comprised of two or more amino-acid connected via peptide bonds.

Alkyl groups include straight-chain, branched and cyclic alkyl groups. Alkyl groups include those having from 1 to 30 carbon atoms. Alkyl groups include small alkyl groups having 1 to 3 carbon atoms. Alkyl groups include medium length alkyl groups having from 4-10 carbon atoms. Alkyl groups include long alkyl groups having more than 10 carbon atoms, particularly those having 10-30 carbon atoms. The term cycloalkyl specifically refers to an alky group having a ring structure such as ring structure comprising 3-30 carbon atoms, optionally 3-20 carbon atoms and optionally 2-10 carbon atoms, including an alkyl group having one or more rings. Cycloalkyl groups include those having a 3-, 4-, 5-, 6-, 7-, 8-, 9- or 10-member carbon ring(s) and particularly those having a 3-, 4-, 5-, 6-, or 7-member ring(s). The carbon rings in cycloalkyl groups can also carry alkyl groups. Cycloalkyl groups can include bicyclic and tricycloalkyl groups. Heterocycloalkyl groups are cycloalkyl groups comprising at least one other kind of atom, in addition to carbon, in the ring. Examples of such heteroatoms include nitrogen, oxygen and sulfur. Heterocycloalkyl rings include heterocyclic alicyclic rings and heterocyclic aromatic rings. Alkyl groups are optionally substituted. Substituted alkyl groups include among others those which are substituted with aryl groups, which in turn can be optionally substituted. Specific alkyl groups include methyl, ethyl, n-propyl, iso-propyl, cyclopropyl, n-butyl, s-butyl, t-butyl, cyclobutyl, n-pentyl, branched-pentyl, cyclopentyl, n-hexyl, branched hexyl, and cyclohexyl groups, all of which are optionally substituted. Substituted alkyl groups include fully halogenated or semihalogenated alkyl groups, such as alkyl groups having one or more hydrogens replaced with one or more fluorine atoms, chlorine atoms, bromine atoms and/or iodine atoms. Substituted alkyl groups include fully fluorinated or semifluorinated alkyl groups, such as alkyl groups having one or more hydrogens replaced with one or more fluorine atoms. An alkoxy group is an alkyl group that has been modified by linkage to oxygen and can be represented by the formula R—O and can also be referred to as an alkyl ether group. Examples of alkoxy groups include, but are not limited to, methoxy, ethoxy, propoxy, butoxy and heptoxy. Alkoxy groups include substituted alkoxy groups wherein the alky portion of the groups is substituted as provided herein in connection with the description of alkyl groups. As used herein MeO— refers to $CH_3O$—.

Alkenyl groups include straight-chain, branched and cyclic alkenyl groups. Alkenyl groups include those having 1, 2 or more double bonds and those in which two or more of the double bonds are conjugated double bonds. Alkenyl groups include those having from 2 to 20 carbon atoms. Alkenyl groups include small alkenyl groups having 2 to 3 carbon atoms. Alkenyl groups include medium length alkenyl groups having from 4-10 carbon atoms. Alkenyl groups include long alkenyl groups having more than 10 carbon atoms, particularly those having 10-20 carbon atoms. Cycloalkenyl groups include those in which a double bond is in the ring or in an alkenyl group attached to a ring. The term cycloalkenyl specifically refers to an alkenyl group having a ring structure, including an alkenyl group having a 3-, 4-, 5-, 6-, 7-, 8-, 9- or 10-member carbon ring(s) and particularly those having a 3-, 4-, 5-, 6- or 7-member ring(s). The carbon rings in cycloalkenyl groups can also carry alkyl groups. Cycloalkenyl groups can include bicyclic and tricyclic alkenyl groups. Alkenyl groups are optionally substituted. Substituted alkenyl groups include among others those which are substituted with alkyl or aryl groups, which groups in turn can be optionally substituted. Specific alkenyl groups include ethenyl, prop-1-enyl, prop-2-enyl, cycloprop-1-enyl, but-1-enyl, but-2-enyl, cyclobut-1-enyl, cyclobut-2-enyl, pent-1-enyl, pent-2-enyl, branched pentenyl, cyclopent-1-enyl, hex-1-enyl, branched hexenyl, cyclohexenyl, all of which are optionally substituted. Substituted alkenyl groups include fully halogenated or semihalogenated alkenyl groups, such as alkenyl groups having one or more hydrogens replaced with one or more fluorine atoms, chlorine atoms, bromine atoms and/or iodine atoms. Substituted alkenyl groups include fully fluorinated or semifluorinated alkenyl groups, such as alkenyl groups having one or more hydrogen atoms replaced with one or more fluorine atoms.

The term "olefin" refers to an alkene compound or an alkenyl group. For example, an olefin refers to the alkenyl group

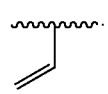

For example, olefin refers to the alkenyl group

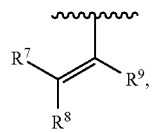

where each of $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof. A metal-olefin pi bond involves coordination of the metal atom or metal ion with the pi bond of the olefin. A metal-olefin pi bond involves donation of electron(s) in the pi-orbital(s) on the olefin to empty orbital(s) on the metal atom or metal ion. The metal-olefin pi bond may involve sharing of electrons in other metal orbital(s) with empty pi-antibonding orbital(s) on the olefin. The term "orbital" refers to a molecular orbital. A metal-olefin pi bond may be represented as

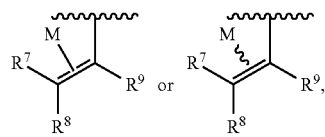

for example, where M is the metal atom or metal ion.

Aryl groups include groups having one or more 5-, 6- or 7-member aromatic rings, including heterocyclic aromatic rings. The term heteroaryl specifically refers to aryl groups having at least one 5-, 6- or 7-member heterocyclic aromatic rings. Aryl groups can contain one or more fused aromatic rings, including one or more fused heteroaromatic rings, and/or a combination of one or more aromatic rings and one or more nonaromatic rings that may be fused or linked via covalent bonds. Heterocyclic aromatic rings can include one or more N, O, or S atoms in the ring. Heterocyclic aromatic rings can include those with one, two or three N atoms, those with one or two O atoms, and those with one or two S atoms, or combinations of one or two or three N, O or S atoms. Aryl groups are optionally substituted. Substituted aryl groups include among others those which are substituted with alkyl or alkenyl groups, which groups in turn can be optionally substituted. Specific aryl groups include phenyl, biphenyl groups, pyrrolidinyl, imidazolidinyl, tetrahydrofuryl, tetrahydrothienyl, furyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, and naphthyl groups, all of which are optionally substituted. Substituted aryl groups include fully halogenated or semihalogenated aryl groups, such as aryl groups having one or more hydrogens replaced with one or more fluorine atoms, chlorine atoms, bromine atoms and/or iodine atoms. Substituted aryl groups include fully fluorinated or semifluorinated aryl groups, such as aryl groups having one or more hydrogens replaced with one or more fluorine atoms. Aryl groups include, but are not limited to, aromatic group-containing or heterocylic aromatic group-containing groups corresponding to any one of the following: benzene, naphthalene, naphthoquinone, diphenylmethane, fluorene, anthracene, anthraquinone, phenanthrene, tetracene, tetracenedione, pyridine, quinoline, isoquinoline, indoles, isoindole, pyrrole, imidazole, oxazole, thiazole, pyrazole, pyrazine, pyrimidine, purine, benzimidazole, furans, benzofuran, dibenzofuran, carbazole, acridine, acridone, phenanthridine, thiophene, benzothiophene, dibenzothiophene, xanthene, xanthone, flavone, coumarin, azulene or anthracycline. As used herein, a group corresponding to the groups listed above expressly includes an aromatic or heterocyclic aromatic group, including monovalent, divalent and polyvalent groups, of the aromatic and heterocyclic aromatic groups listed herein are provided in a covalently bonded configuration in the compounds of the invention at any suitable point of attachment. In embodiments, aryl groups contain between 5 and 30 carbon atoms. In embodiments, aryl groups contain one aromatic or heteroaromatic six-membered ring and one or more additional five- or six-membered aromatic or heteroaromatic ring. In embodiments, aryl groups contain between five and eighteen carbon atoms in the rings. Aryl groups optionally have one or more aromatic rings or heterocyclic aromatic rings having one or more electron donating groups, electron withdrawing groups and/or targeting ligands provided as substituents.

Arylalkyl groups are alkyl groups substituted with one or more aryl groups wherein the alkyl groups optionally carry additional substituents and the aryl groups are optionally substituted. The terms alkylaryl and arylalkyl may be used interchangeably. Specific alkylaryl groups are phenyl-substituted alkyl groups, e.g., phenylmethyl groups. Alkylaryl groups are alternatively described as aryl groups substituted with one or more alkyl groups wherein the alkyl groups optionally carry additional substituents and the aryl groups are optionally substituted. Specific alkylaryl groups are alkyl-substituted phenyl groups such as methylphenyl. Substituted arylalkyl groups include fully halogenated or semihalogenated arylalkyl groups, such as arylalkyl groups having one or more alkyl and/or aryl groups having one or more hydrogens replaced with one or more fluorine atoms, chlorine atoms, bromine atoms and/or iodine atoms.

As to any of the groups described herein which contain one or more substituents, it is understood that such groups do not contain any substitution or substitution patterns which are sterically impractical and/or synthetically non-feasible. Optional substitution of alkyl groups includes substitution with one or more alkenyl groups, aryl groups or both, wherein the alkenyl groups or aryl groups are optionally substituted. Optional substitution of alkenyl groups includes substitution with one or more alkyl groups, aryl groups, or both, wherein the alkyl groups or aryl groups are optionally substituted. Optional substitution of aryl groups includes substitution of the aryl ring with one or more alkyl groups, alkenyl groups, or both, wherein the alkyl groups or alkenyl groups are optionally substituted.

Optional substituents for any alkyl, alkenyl and aryl group includes substitution with one or more of the following substituents, among others:
halogen, including fluorine, chlorine, bromine or iodine;
pseudohalides, including —CN;

—COOR where R is a hydrogen or an alkyl group or an aryl group and more specifically where R is a methyl, ethyl, propyl, butyl, or phenyl group all of which groups are optionally substituted;

—COR where R is a hydrogen or an alkyl group or an aryl group and more specifically where R is a methyl, ethyl, propyl, butyl, or phenyl group all of which groups are optionally substituted;

—CON(R)$_2$ where each R, independently of each other R, is a hydrogen or an alkyl group or an aryl group and more specifically where R is a methyl, ethyl, propyl, butyl, or phenyl group all of which groups are optionally substituted; and where R and R can form a ring which can contain one or more double bonds and can contain one or more additional carbon atoms;

—OCON(R)$_2$ where each R, independently of each other R, is a hydrogen or an alkyl group or an aryl group and more specifically where R is a methyl, ethyl, propyl, butyl, or phenyl group all of which groups are optionally substituted; and where R and R can form a ring which can contain one or more double bonds and can contain one or more additional carbon atoms;

—N(R)$_2$ where each R, independently of each other R, is a hydrogen, or an alkyl group, or an acyl group or an aryl group and more specifically where R is a methyl, ethyl, propyl, butyl, phenyl or acetyl group, all of which are optionally substituted; and where R and R can form a ring which can contain one or more double bonds and can contain one or more additional carbon atoms; —SR, where R is hydrogen or an alkyl group or an aryl group and more specifically where R is hydrogen, methyl, ethyl, propyl, butyl, or a phenyl group, which are optionally substituted;

—SO$_2$R, or —SOR where R is an alkyl group or an aryl group and more specifically where R is a methyl, ethyl, propyl, butyl, or phenyl group, all of which are optionally substituted;

—OCOOR where R is an alkyl group or an aryl group;

—SO$_2$N(R)$_2$ where each R, independently of each other R, is a hydrogen, or an alkyl group, or an aryl group all of which are optionally substituted and wherein R and R can form a ring which can contain one or more double bonds and can contain one or more additional carbon atoms; and —OR where R is H, an alkyl group, an aryl group, or an acyl group all of which are optionally substituted. In a particular example R can be an acyl yielding —OCOR" where R" is a hydrogen or an alkyl group or an aryl group and more specifically where R" is methyl, ethyl, propyl, butyl, or phenyl groups all of which groups are optionally substituted.

Specific substituted alkyl groups include haloalkyl groups, particularly trihalomethyl groups and specifically trifluoromethyl groups. Specific substituted aryl groups include mono-, di-, tri, tetra- and pentahalo-substituted phenyl groups; mono-, di-, tri-, tetra-, penta-, hexa-, and hepta-halo-substituted naphthalene groups; 3- or 4-halo-substituted phenyl groups, 3- or 4-alkyl-substituted phenyl groups, 3- or 4-alkoxy-substituted phenyl groups, 3- or 4-RCO-substituted phenyl, 5- or 6-halo-substituted naphthalene groups. More specifically, substituted aryl groups include acetylphenyl groups, particularly 4-acetylphenyl groups; fluorophenyl groups, particularly 3-fluorophenyl and 4-fluorophenyl groups; chlorophenyl groups, particularly 3-chlorophenyl and 4-chlorophenyl groups; methylphenyl groups, particularly 4-methylphenyl groups; and methoxyphenyl groups, particularly 4-methoxyphenyl groups.

Many of the molecules disclosed herein contain one or more ionizable groups. Ionizable groups include groups from which a proton can be removed (e.g., —COOH) or added (e.g., amines) and groups that can be quaternized (e.g., amines). All possible ionic forms of such molecules and salts thereof are intended to be included individually in the disclosure herein. With regard to salts of the compounds herein, one of ordinary skill in the art can select from among a wide variety of available counterions that are appropriate for preparation of salts of this invention for a given application. In specific applications, the selection of a given anion or cation for preparation of a salt can result in increased or decreased solubility of that salt.

The compounds of this invention can contain one or more chiral centers. Accordingly, this invention is intended to include racemic mixtures, diastereomers, enantiomers, tautomers and mixtures enriched in one or more stereoisomer. The scope of the invention as described and claimed encompasses the racemic forms of the compounds as well as the individual enantiomers and non-racemic mixtures thereof.

As to any of the above groups which contain one or more substituents, it is understood that such groups do not contain any substitution or substitution patterns which are sterically impractical and/or synthetically non-feasible.

In an embodiment, a composition, compound, complex, precursor, catalyst, or formulation of the invention, such as a metal-ligand complex or a vapor-to-solid precursor, is isolated or substantially purified. In an embodiment, an isolated or purified compound is at least partially isolated or substantially purified as would be understood in the art. In an embodiment, a substantially purified composition, compound, complex, or formulation of the invention has a chemical purity of 95%, optionally for some applications 99%, optionally for some applications 99.9%, optionally for some applications 99.99%, and optionally for some applications 99.999% pure.

DETAILED DESCRIPTION OF THE INVENTION

In the following description, numerous specific details of the devices, device components and methods of the present invention are set forth in order to provide a thorough explanation of the precise nature of the invention. It will be apparent, however, to those of skill in the art that the invention can be practiced without these specific details.

The compositions and methods now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements.

Likewise, many modifications and other embodiments of the compositions and methods described herein will come to mind to one of skill in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

Unless defined otherwise, all technical and scientific terms used herein have the same meaning as commonly understood by one of skill in the art to which the invention pertains. Although any methods and materials similar to or equivalent to those described herein can be used in the practice or testing of the present invention, the preferred methods and materials are described herein.

Overview:

Disclosed herein is a new class of metal-ligand complexes. These metal-ligand complexes may comprise $\eta^1,\eta^2$-$\beta,\beta$-disubstituted-$\omega$-alkenyl ligands. These metal-ligand complexes may be useful for CVD or ALD formation of metal, metal oxides, metal nitrides, and other binary and higher-order metal containing phases on substrates, as well as to methods of making and using such precursor compounds. $\eta^1,\eta^2$-$\beta,\beta$-disubstituted-$\omega$-alkenyl ligands are defined here as organic groups in which a carbon atom at or near the end of a chain of four or more atoms forms a metal-carbon sigma bond ($\eta^1$ binding mode) and a carbon-carbon double bond at or near the other end of the chain of atoms coordinates to the metal in a pi fashion ($\eta^2$ binding mode). These ligands differ from allyl (also known as propenyl) type ligands in that at least one atom intervenes between the two places of attachment to the metal center.

Figure 11:
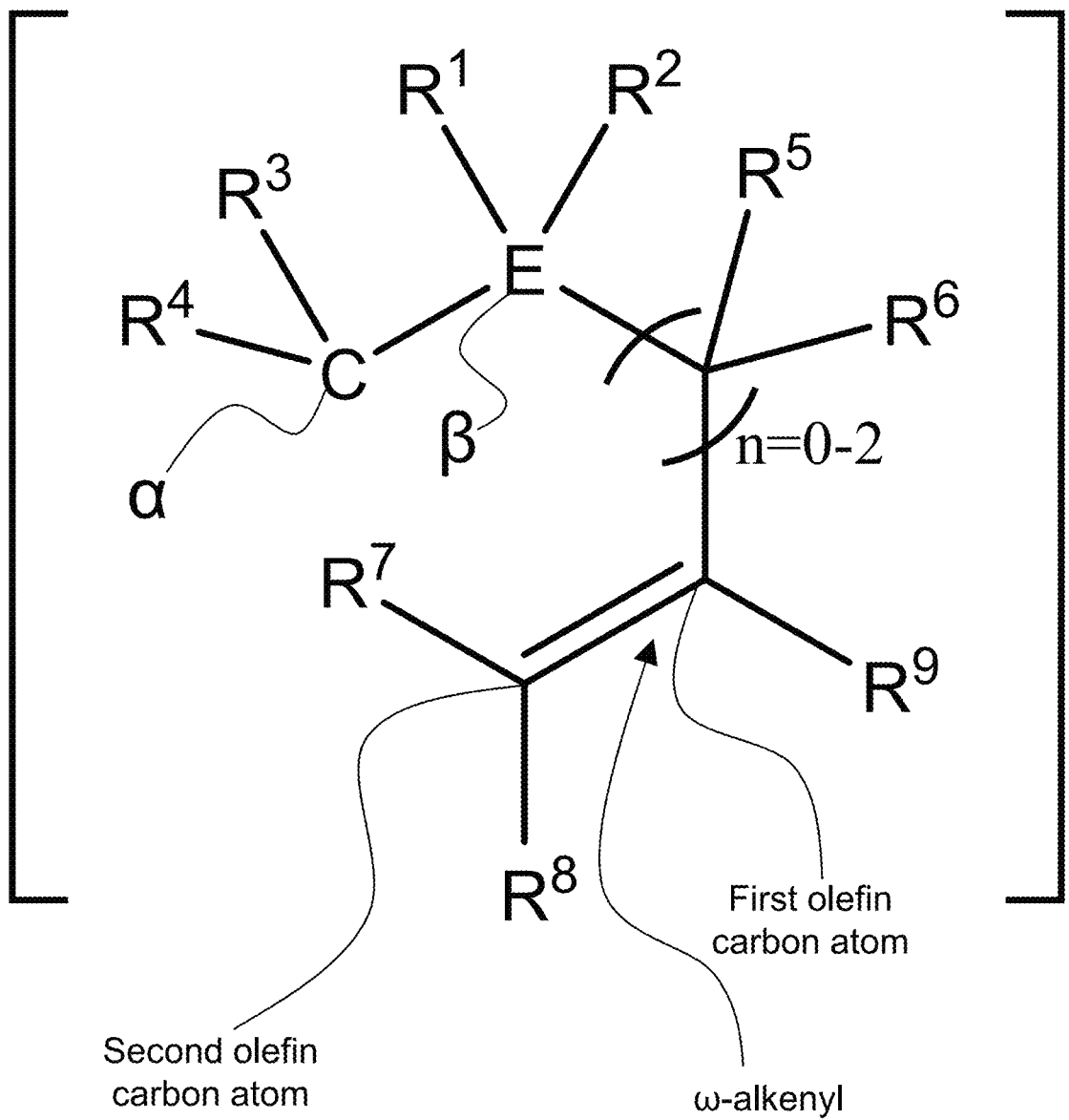
FIG. 11. Chemical structure drawing depicting a ligand characterized by formula FX2 of a metal-ligand complex corresponding to formula FX1, such as the metal-ligand complex of FIG. 2.

FIG. 11 shows a chemical structure drawing corresponding to the ligands disclosed herein characterized by formula FX2 (see below). FIG. 11 identifies the carbon atom in the $\alpha$-position (carbon labeled 'C') and identifies the atom in the $\beta$-position (atom labeled 'E', which may be C or Si, for example). These ligands have substituents $R^1$ and $R^2$ at the $\beta$-positions. These ligands do not have a $\beta$-hydrogen (i.e., each of the functional groups $R^1$ and $R^2$ at the $\beta$-position is not a hydrogen). These ligands disclosed herein have advantages over compounds that lack the two substituents at the $\beta$-positions. For example, the ligand cis-bis(pent-4-en-1-yl), in cis-bis(pent-4-en-1-yl)platinum, lacks two substituents at the $\beta$-positions. The presence of the two substituents at the $\beta$-positions of the carbon chain prevents decomposition of the metal-ligand complex via beta hydrogen elimination, and increases the thermal stability of metal-ligand complex containing the ligand(s) disclosed herein, such as those characterized by formula FX2 (e.g., $\eta^1,\eta^2$-$\beta,\beta$-disubstituted-$\omega$-alkenyl ligands) compared to complexes with ligand(s) that lack substituents at the $\beta$-position(s) of the chain. For clarity of discussion below, FIG. 11 further identifies the carbon atom corresponding to the first olefin carbon atom and identifies the carbon atom corresponding to the second olefin carbon atom. Additionally, FIG. 11 identifies the $\omega$-alkenyl. In an embodiment, $\omega$ indicates that the double bond is located at or near the opposite end of the chain of atoms in ligand L, relative to the first, or $\alpha$ position. For example, $\omega$ is 4 (first olefin carbon is the $4^{th}$ carbon in the chain, where the count starts at the carbon labeled 'C') in 2,2-dimethylpent-4-en-1-yl.

In one aspect, the present invention may include methods for making metal-ligand complexes bearing at least one ligand characterized by formula FX2, which may be described as $\eta^1,\eta^2$-$\beta,\beta$-disubstituted-$\omega$-alkenyl ligands, and in another aspect the present invention relates to a method of depositing metal-containing layers or nanostructures on substrates by vaporizing metal-ligand complexes bearing $\eta^1,\eta^2$-$\beta,\beta$-disubstituted-$\omega$-alkenyl ligands and decomposing them, either in the absence or presence of other reactive gases, to form a film on a surface or other structure. Other aspects, features and embodiments of the invention will be more fully apparent from the discussion and claims presented herein.

The present invention may include methods for making neutral, volatile metal compounds bearing $\eta^1,\eta^2$-$\beta,\beta$-disubstituted-$\omega$-alkenyl ligands, which are useful for forming metal, metal oxides, metal nitrides, metal carbides, metal borides, and other binary and higher-order metal-containing thin films and nanostructures on substrates.

For example, the metal-ligand complexes disclosed herein are characterized by formula (FX1): $ML_xD_y$ (FX1), wherein:

M is a metal; x is equal to the oxidation state of M; each D is independently a neutral coordinating ligand; y is zero or an integer selected from the range of 1 to 4; and each L is a mono-anionic ligand independently characterized by the formula FX2:

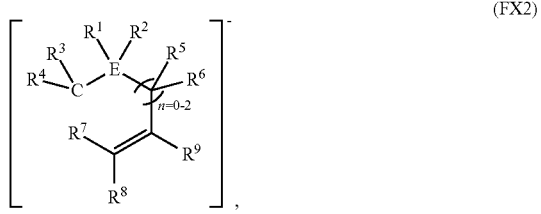

(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of these metal-ligand complexes, at least one of $R^1$ and $R^2$ is not a fluoride (F—) or a trifluoromethyl ($CF_3$—) group. In some embodiments of these metal-ligand complexes, at least one of $R^1$ and $R^2$ is not a fluoride or a $C_1$-$C_6$ fluoroalkyl. In some embodiments of these metal-ligand complexes, each of both $R^1$ and $R^2$ is not a fluoride or a trifluoromethyl. In some embodiments of these metal-ligand complexes, each of both $R^1$ and $R^2$ is not a fluoride or a $C_1$-$C_6$ fluoroalkyl.

For example, the metal complexes disclosed herein are characterized by formula FX1:

$$ML_xD_y \quad \text{(FX1)}$$

wherein:
M is a metal chosen from the group consisting of: Li, Be, Mg, Ca, Sr, Ba, Al, Sc, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Ga, Sn, a lanthanide metal, or an actinide metal;
x is equal to the oxidation state of M;
each D is independently a neutral coordinating ligand; y is zero or an integer from 1 to 4; and each L is independently a $\eta^1,\eta^2$-β,β-disubstituted-ω-alkenyl group that is characterized by the structure of formula FX2:

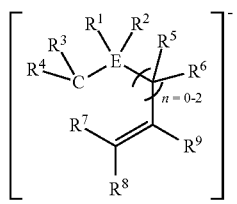

(FX2)

wherein:
n is 0, 1, or 2; $R_1$ and $R_2$ may be the same as or different from one another and each of $R_1$ and $R_2$ are selected from the group consisting of $C_1$-$C_6$ alkyl, $C_3$-$C_8$ cycloalkyl, haloalkyl, arylalkyl, alkoxy, $C_6$-$C_{10}$ aryl, substituted aryl, heteroaryl, silyl, alkenyl, alkynyl, and halogen; $R^3$, $R^4$, $R^5$, $R^6$, $R^7$, $R^8$, and $R^9$ may be the same as or different from one another and each of $R^3$, $R^4$, $R^5$, $R^6$, $R^7$, $R^8$, and $R^9$ are selected from the group consisting of H, $C_1$-$C_6$ alkyl, $C_3$-$C_8$ cycloalkyl, haloalkyl, arylalkyl, alkoxy, $C_6$-$C_{10}$ aryl, substituted aryl, heteroaryl, silyl, alkenyl, alkynyl, and halogen; $R_1$, $R_2$, $R^3$, $R^4$, $R^5$, $R^6$, $R^7$, $R^8$, and $R^9$ may be connected to each other by alkyl groups or fluoroalkyl groups; and E is C or Si. In some embodiments, at least one of groups $R^1$ and $R^2$ is not a fluoride or a trifluoromethyl group. In some embodiments, each of $R^1$ and $R^2$ is not a fluoride or a trifluoromethyl group.

In an embodiment, the ligand L characterized by formula FX2, n is 0, 1, or 2. In an embodiment, where n is 0, the ligand L is characterized by the formula FX2a:

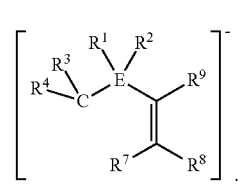

(FX2a)

In an embodiment, where n is 0 and L is characterized by FX2a, ligand L may be described as having atom E directly bonded to the first olefin carbon atom, and as being free of $R^5$ and $R^6$. In an embodiment, formula FX2 corresponds to formula FX2a when n is 0. In an embodiment, where n is 1, the ligand L is characterized by the formula FX2b:

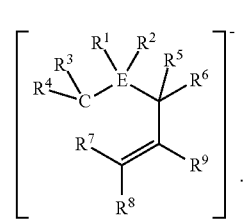

(FX2b)

In an embodiment, where n is 1 and L is characterized by FX2b, ligand L may be described as having one carbon atom separating atom E from the first olefin carbon atom along the chain, and as having $R^5$ and $R^6$ present, as shown in FX2b. In an embodiment, formula FX2 corresponds to formula FX2b when n is 1. In an embodiment, where n is 2, the ligand L is characterized by the formula FX2c:

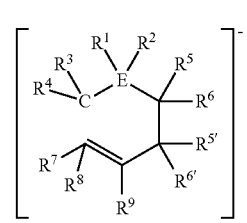

(FX2c)

In an embodiment, where n is 2 and L is characterized by FX2c, ligand L may be described as having atom E separated from the first olefin carbon by two carbon atoms along the chain. In an embodiment, when n is 2, $R^5$ and $R^{5'}$ may be the same or different, and $R^6$ and $R^{6'}$ may be the same or different. In an embodiment, each of $R^3$, $R^4$, $R^5$, $R^{5'}$, $R^6$, $R^{6'}$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof. In an embodiment, formula FX2 corresponds to formula FX2c when n is 2.

Preferred metals for M are Li, Mg, Al, Cr, Mo, W, Mn, Re, Fe, Ru, Os, Co, Rh, Ir, Ni, Pd, Pt, Cu, Ag, Au or Zn. The metal center M may be Li, Mg, Rh, Pt or Ir.

A small number of compounds bearing ligands resembling those of FX2 have been described previously. Examples include those reported by T. C. Flood, et al. (*J. Am. Chem. Soc.* 1984, 106, 6077), S. P. Ermer et al. (*Organometallics* 1993, 12, 2634), C. G. Brandow et al. (*Organometallics* 2001, 20, 4253), M. Bottrill et al. (*J. Chem. Soc., Dalton Trans.,* 1979, 0, 1671-1678), I. Omae (*Angew. Chem. Int. Ed. Engl.,* 1982, 21, 889-902), M. Green et al. (*J. Chem. Soc., Dalton Trans.,* 1975, 0, 1128-1137), and H. Lehmkuhl et al. (*J. Organomet. Chem.* 1981, 216(3), $C_{41}$-$C_{44}$). In some cases, for example, these compounds have at least one β-hydrogen and/or the number (i.e., x in FX1) of mono-anionic ligands resembling FX2 is not equal to the oxidation number of the metal center. Additionally, it was not conventionally recognized these metal-ligand complexes may be useful as CVD or ALD precursors, or more generally vapor-to-solid precursors.

The compounds characterized by formula FX1 may be prepared in a variety of suitable ways. One method to prepare the compounds characterized by formula FX1, for example, is adding $\eta^1,\eta^2$-β,β-disubstituted-ω-alkenyl magnesium bromide (a Grignard reagent) to a suitable starting material, such as a metal halide or a Lewis base adduct of a metal halide, followed by extracting or subliming the products from the reaction mixtures. Instead of a Grignard reagent, an organolithium reagent may be used in some embodiments.

The solvents that are suitable for preparation of the compounds of the present invention can be one or more of the followings: no solvent (solventless solid state reaction), ethers, polyethers, cyclic ethers, thioethers, amines (aliphatic or aromatic, primary, secondary, or tertiary), polyamines, nitriles, cyanates, isocyanates, thiocyanates, esters, aldehydes, toluene, saturated or unsaturated hydrocarbons (linear, branched, or cyclic), halogenated hydrocarbons, silylated hydrocarbons, amides or compounds containing combinations of any of the above functional groups, or mixtures of two or more of the above. In a preferred embodiment, the solvent system includes, for example, a solventless solid state reaction system, or a solution reaction employing either noncoordinating or coordinating solvents such as alkanes (e.g., pentane), ethers (e.g., diethylether), polyethers (e.g., 1,2-dimethoxyethane), cyclic ethers (e.g., tetrahydrofuran), aromatic solvents (e.g., toluene), or mixtures of two or more of the above.

The product can be isolated from the reaction mixture in many different ways including, for example, sublimation, distillation, or crystallization from a solution. Typically, highly pure product is isolated by repeated recrystallization or sublimation.

The ligands D that are suitable for use in the preparation of compounds characterized by formula FX1 include neutral ligands. Examples of such ligands include ethers ($R_2O$), amines ($R_3N$), nitriles (RCN), isonitriles (RNC), phosphines ($R_3P$), phosphites (($RO)_3P$), arsines ($R_3As$), stibenes ($R_3Sb$), sulfides (CS), monoalkenes (linear, branched, or cyclic), dienes (linear, branched, or cyclic), trienes (linear, branched, or cyclic), bicyclic alkenes, bicyclic dienes, bicyclic trienes, tricyclic dienes, tricyclic trienes, and alkynes, in which R groups are those made from one or more non-metal atoms. The R groups in the neutral ligands D are preferably selected from the group consisting of $C_1$-$C_6$ alkyl, $C_3$-$C_8$ cycloalkyl, haloalkyl, arylalkyl, $C_6$-$C_{10}$ aryl, substituted aryl, heteroaryl, acyl, silyl, alkenyl and alkynyl. In the neutral ligands D that contain more than two R groups, the R groups may be the same as or different from one another or may represent one hydrocarbon chain. Preferably, the neutral ligands D are selected from the groups of linear mono-ethers, linear polyethers, cyclic monoethers, cyclic polyethers, mono-amines, linear polyamines, cyclic mono-amines, or cyclic polyamines. As a precursor compound for CVD or ALD of thin films, a complex characterized by formula FX1 with y=0 may be preferred, for example to afford the complex a desired volatility.

The metal complexes characterized by formula FX1 in the present invention may be decomposed on a substrate and form a layer containing one or more substances in the form of inorganic compounds including, for example, metal, metal oxides, metal nitrides, metal carbides, metal borides, or other binary and higher-order phases. A metal complex is preferably delivered and decomposed as a vapor in a metal organic chemical vapor deposition (MOCVD), molecular beam epitaxy (MBE), or atomic layer deposition (ALD) process.

The complexes characterized by formula FX1 may be used in CVD processes, in which vapors of precursor complexes are introduced onto the substrate on which decomposition of the precursor molecules occurs to afford metal-containing solid material, such as a thin film. Thicker films can be obtained by longer exposure of the surface to the precursor. The compounds characterized by formula FX1 may also be used in ALD processes, which involves sequential exposure of a surface to two or more gases, one of which may be a metal-containing precursor. In a typical ALD process, the first reactant is introduced onto the substrate to form a thin layer of the first reactant. The conditions are chosen such that the deposition of this layer is self-limiting, such that further exposure leads to no additional deposition. After excess unreacted first reactant and by products are pumped away, the second reactant is introduced onto the substrate. The second reactant reacts with the thin layer of the first reactant. Again the conditions are chosen such that the deposition of this second layer is self-limiting, such that further exposure leads to no additional deposition. Then, the unreacted second reactants and byproducts from the surface reactions are pumped away. By repeating this cycle, the desired thickness of the films can be deposited.

An apparatus for deposition of layers from gaseous metal complexes is typically pressure tight and can be evacuated. Thus, deposition processes are typically carried out under reduced pressure and the metal complexes are transported into the apparatus as vapors. Inert or reactive carrier gases, or other gaseous co-reactants can also be introduced into the apparatus. Decomposition of the precursors on a substrate is conducted by known methods such as thermal decomposition, plasma, radiation-induced decomposition, or photolytic decomposition. The principles of processes and apparatus for deposition of films are well known in the art.

The vaporization of precursors may be carried out by conventional vaporization methods from solid precursors. The vaporization methods may also include the nebulization of solid precursors, where before the nebulization, solid precursors may be dissolved in organic solvents, including hydrocarbons such as decane, dodecane, tetradecane, toluene, xylene, and mesitylene, as well as ethers, esters, ketones, alcohols, or chlorinated hydrocarbons. The precursor solution may also be delivered onto a substrate by direct injection of the solutions. Carrier gas that is passed through or over the precursor may be used to enhance the vaporization of the precursor especially when higher precursor flux is needed.

The decomposition of metal complexes in CVD or ALD processes affords layers containing one or more metals on substrates. Metal or metal carbides are often deposited if the metal complexes are decomposed under inert condition in which no other vapor except the metal complex vapor or inert gas such as argon, or in which a reducatant such as hydrogen, methanol, ethanol, or hydroquinone is added. If the decomposition is carried out under oxidizing atmosphere in which gas molecules containing oxygen such as water, oxygen, ozone, carbon dioxide or nitrogen dioxide is present, metal oxides are formed. When amine species such as ammonia or hydrazine are used as gaseous coreactants, layers containing metals in the form of nitrides or carbonnitride are deposited. In one embodiment of the invention, the metal complexes in this invention may be used for making alloy or be used as dopants in small amounts in other phases: for example, the platinum compound characterized by formula FX1 may be used as the platinum source for Co—Cr—Pt alloy film.

The present invention will be further illustrated by the following non-limiting examples. The particular materials, amounts, conditions, and other details in these examples should not be construed to limit the scope of the present invention to their details.

Example 1. Synthesis of (2,2-dimethylpent-4-en-1-yl)lithium

All experiments were carried out under vacuum or under argon by using standard Schlenk techniques. Solvents were distilled under nitrogen from sodium/benzophenone immediately before use.

A 100 mL Schleck flask was charged with a glass-coated stirring bar, lithium granules (4-10 mesh, trace metals grade, 3.0 g, 432 mmol), pentane (30 mL) and 5-bromo-4,4-dimethylpent-1-ene (6.0 g, 34 mmol); the latter was added in one portion. The mixture was stirred for 24 h at room temperature and then was cooled to −20° C. and diluted by slow addition of diethyl ether (30 mL). The mixture was stirred at −20° C. for 10 h, and then the solvent was removed at −20° C. The residue was extracted with pentane (2×25 mL). The yellow extract was filtered, concentrated to ca. 3 mL, and cooled to −78° C. The off-white solid was collected and washed with cold pentane (2×2 mL). A second crop can be obtained by concentrating the mother liquor and cooling to −78° C. Combined yield: 2.28 g, 65%. Anal. Calcd for $C_7H_{13}Li$: C, 80.7; H, 12.8. Found: C, 80.6; H, 12.4. $^1H$ NMR (500 MHz, $C_6D_{12}$, 20° C.): δ −0.83 (br s, 2H, Li—$CH_2$), 1.06 (s, 6H, β—$CMe_2$), 2.04 (d, 2H, $^3J_{HH}$=7.4 Hz, γ-$CH_2$), 5.11 (d, 1H, $^3J_{HH}$=17.3 Hz, =$CH_2$), 5.17 (d, 1H, $^3J_{HH}$=10.0 Hz, =$CH_2$), 6.19 (m, 1H, —CH=). $^{13}C$ NMR (500 MHz, $C_6D_{12}$, 20° C.): δ 32.76 (br s, Li—$CH_2$), 36.17 (s, Me), 38.81 (s, β-C), 52.80 (s, γ-$CH_2$), 116.87 (s, =$CH_2$), 142.92 (s, —CH=).

The crystal structure of (2,2-dimethylpent-4-en-1-yl) lithium shows (FIG. 1) that this compound is an unsolvated tetramer. The four lithium atoms form a distorted tetrahedron. The α-carbon atoms of the five-carbon chain are bound to the faces of the tetrahedron (i.e., they are triply bridging with respect to three lithium atoms) and the C=C double bonds at the ends of the chains each coordinate to a different lithium atom. Overall, the (2,2-dimethylpent-4-en-1-yl) lithium tetramer has approximate S4 symmetry.

Example 2. Synthesis of cis-bis($\eta^1,\eta^2$-2,2-dimethylbut-3-en-1-yl)platinum A 100 mL Schleck flask was charged with a glass-coated stirring bar, lithium granules (4-10 mesh, trace metals grade, 3.0 g, 430 mmol), pentane (20 mL), and 4-bromo-3,3-dimethylbutene (6.0 g, 37 mmol); the latter was added in one portion. The mixture was stirred at room temperature for 12 h and then was cooled to −20° C. and diluted by slow addition of diethyl ether (20 mL). The mixture was stirred at −20° C. this temperature for 12 h. The solvent was removed at −20° C. and the residue was extracted with pentane (2×20 mL) to give a light yellow solution of (2,2-dimethylbut-3-en-1-yl)lithium. An aliquot of this solution was titrated to establish its concentration (0.22 M, 8.8 mmol, 29%).

A Schlenk flask was charged with $(COD)PtCl_2$ (0.15 g, 0.40 mmol) and diethyl ether (20 mL) and cooled to −78° C. To this mixture was added the lithium reagent (20 mL of a 0.22 M solution in pentane, 4.4 mmol). The mixture was stirred at −78° C. for 5 h and was warmed to −20° C. The solvent was slowly removed at −20° C., and to the residue was added pentane (2×20 mL). The solution was quenched at 0° C. with of $H_2O$ (5 drops), and dried over $Na_2SO_4$ at 0° C. The mixture was then cooled to −78° C. and filtered, and the solvent was evaporated at −20° C. to give a brown oil. Pure product can be obtained by column chromatography using pentane as eluent. Slow evaporation of the solvent at −20° C. gives the title compound as a white solid, which melts at room temperature to form a light yellow oil. This compound can be stored indefinitely at −20° C. M.p.<−10° C. $^1H$ NMR (400 MHz, $C_6D_6$, 20° C.): δ 0.97 (br s, 4H, Pt—$CH_2$), 1.11 (br s, 12H, β-$CMe_2$), 3.45 (d, 2H, $^3J_{HH}$=8.8 Hz, =$CH_2$), 3.70 (d, 2H, $^3J_{HH}$=15.5 Hz, $^2J_{PtH}$=38.6 Hz, =$CH_2$), 4.42 (dd, 2H, $^3J_{HH}$=8.8 Hz, 15.5 Hz, $^2J_{PtH}$=40.6 Hz, —CH=). $^{13}C$ NMR (101 MHz, $C_6D_6$, 20° C.): δ 5.60 (s, $^1J_{PtC}$=613.7 Hz, Pt—$CH_2$), 32.68 (s, $^3J_{PtC}$=42.6 Hz, Me), 37.83 (s, β-C), 74.95 (s, $^1J_{PtC}$=25.4 Hz, =$CH_2$), 99.80 (br s, —CH=).

The molecular structure of cis-bis($\eta^1,\eta^2$-2,2-dimethylbut-3-en-1-yl)platinum is similar to that of cis-bis($\eta^1,\eta^2$-2,2-dimethylpent-4-en-1-yl)platinum (see below) except that the ligand has one fewer carbon atom in the chain. The geometry about the Pt center is distorted square planar and the molecule has crystallographic $C_2$ symmetry.

Example 3. Synthesis of cis-bis($\eta^1,\eta^2$-2,2-dimethylpent-4-en-1-yl)platinum A 250 mL three-necked flask under argon was charged with magnesium turnings (4.0 g, 170 mmol), diethyl ether (20 mL), and 1,2-dibromoethane (9 drops). The mixture was heated to reflux for 12 h to activate the magnesium and then was treated with 5-bromo-4,4-dimethylpent-1-ene (4.25 g, 24.0 mmol), which was added in one portion. The mixture was heated to reflux for 12 h, and then the mixture was filtered. The solid was washed with diethyl ether (2×10 mL) and the washings were filtered and combined with the original filtrate to give a light yellow solution of (2,2-dimethylpent-4-en-1-yl)magnesium bromide. An aliquot of the solution was titrated to establish its concentration.

A Schlenk flask was charged with $(COD)PtCl_2$ (1.50 g, 3.99 mmol) and diethyl ether (20 mL), and cooled to 0° C. The resulting mixture was treated with the Grignard reagent (23 mL of a 0.41 M solution in diethyl ether; 9.4 mmol), and afterward was stirred for 2 h at 0° C. and then warmed to room temperature. The mixture was filtered, the solid residue was washed with diethyl ether (20 mL), and the washing was filtered and added to original filtrate. The solvent was removed from the filtrate under reduced pressure. The resulting slurry was extracted with pentane (2×20 mL) and the solvent was removed under vacuum. The resulting yellow oil was purified by silica gel column chromatography to obtain the title compound as a light yellow oil. The oil was recrystallized from ethanol at −20° C. to give the product as an air- and water-stable light yellow solid that easily melts to a liquid. Yield: 0.99 g, 64%. This compound can be stored indefinitely at −20° C. M.p. 19-20° C. Anal. Calcd for $C_{14}H_{26}Pt$: C, 43.2; H, 6.73.

Found: C, 43.0; H, 6.64. $^1$H NMR (400 MHz, $C_6D_6$, 20° C.): (1.18 (s, 6H, $^4J_{PtH}$=10.1 Hz, β-CMe$_2$ equatorial), 1.29 (s, 6H, β-CMe$_2$ axial), 1.47 (dd, $^2J_{HH}$=11.8 Hz, $^3J_{HH}$=9.1 Hz, 2H, γ-CH$_2$ axial), 1.64 (d, $^2J_{HH}$=11.7 Hz, $^2J_{PtH}$=102.7 Hz, 2H, Pt—CH$_2$ axial), 1.47 (dd, $^2J_{HH}$=11.8 Hz, $^3J_{HH}$=4.4 Hz, 2H, γ-CH$_2$ equatorial), 1.64 (d, $^2J_{HH}$=11.7 Hz, $^2J_{PtH}$=34.3 Hz, 2H, Pt—CH$_2$ equatorial), 3.41 (d, 2H, $^3J_{HH}$=8.0 Hz, $^2J_{PtH}$=29.6 Hz, =CH$_2$), 3.60 (d, 2H, $^3J_{HH}$=14.7 Hz, $^2J_{PtH}$=39.5 Hz, =CH$_2$), 4.53 (m, 2H, —CH=). $^{13}$C NMR (101 MHz, $C_6D_6$, 20° C.): (32.05 (s, $^3J_{PtC}$=28.8 Hz, Me axial), 33.19 (s, $^3J_{PtC}$=99.8 Hz, Me equatorial), 43.38 (s, $^1J_{PtC}$=842.4 Hz, Pt—CH$_2$), 48.69 (s, γ-CH$_2$), 51.19 (s, β-C), 88.92 (s, $^1J_{PtC}$=29.3 Hz, =CH$_2$), 113.10 (s, $^1J_{PtC}$=16.0 Hz, —CH=).

Figure 2:
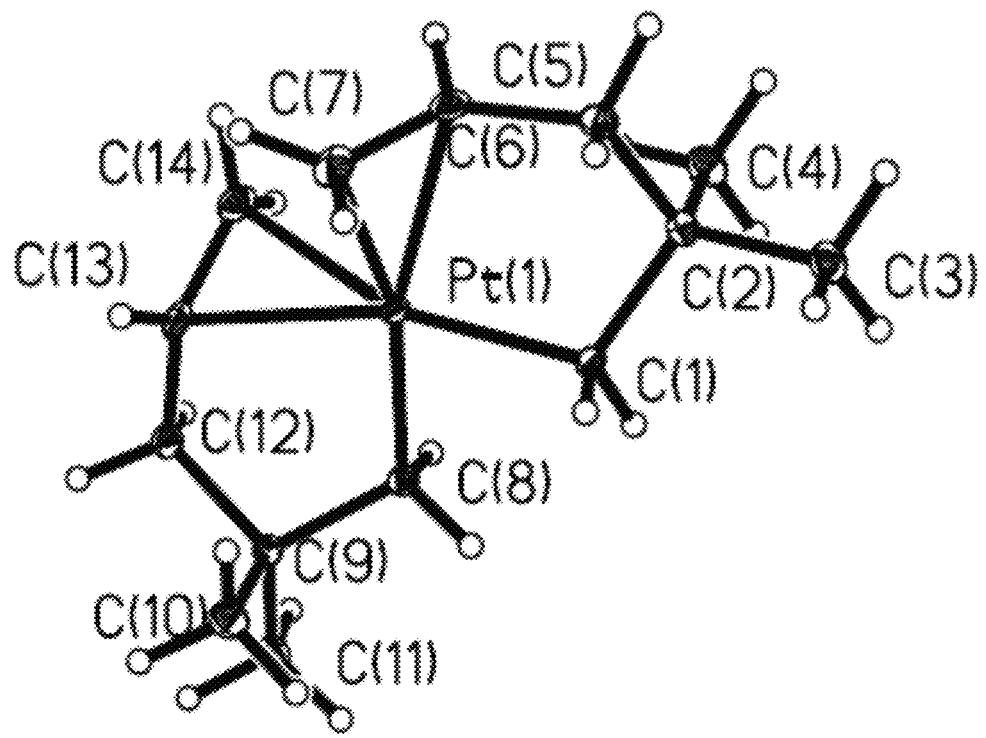
FIG. 2. Molecular structure of cis-bis($\eta^1,\eta^2$-2,2-dimethylpent-4-en-1-yl)platinum. Ellipsoids are drawn at the 35% probability level.

The crystal structure of cis-bis($\eta^1,\eta^2$-2,2-dimethylpent-4-en-1-yl)platinum shows (FIG. 2) that this compound contains two bidentate $\eta^1,\eta^2$-2,2-dimethylpent-4-en-1-yl ligands bound to the platinum center by means of a Pt—C sigma bond at one end of the five-carbon chain and by a Pt-olefin pi bond at the other. The two sigma bonds are cis, and the molecule has approximate C$_2$ symmetry.

Example 4. Synthesis of cis-bis($\eta^1,\eta^2$-2,2-dimethyl-hex-5-en-1-yl)platinum The synthesis of this compound can be accomplished in a fashion similar to that of cis-bis($\eta^1,\eta^2$-2,2-dimethylpent-4-en-1-yl)platinum in example 2, except using 6-bromo-5,5-dimethylhex-1-ene instead of 5-bromo-4,4-dimethylpent-1-ene. The product is obtained as yellow crystals. M.p. 46-47° C. Anal. Calcd for $C_{16}H_{30}Pt$: C, 46.0; H, 7.24.

Found: C, 46.2; H, 6.91. $^1$H NMR (500 MHz, $C_6D_6$, 20° C.): δ 1.08 (br s, 6H, β-CMe$_2$ axial), 1.21 (br s, 6H, β-CMe$_2$ equatorial), 1.25 (br s, 2H, γ-CH$_2$), 1.61-1.82 (m, 4H, γ-CH$_2$ & β-CH$_2$), 1.88 (d, $^2J_{HH}$=9 Hz, $^1J_{PtH}$=100.6 Hz, 2H, Pt—CH$_2$ axial), 2.16 (m, 2H, 5-CH$_2$), 1.64 (d, $^2J_{HH}$=9 Hz, $^1J_{PtH}$=62 Hz, 2H, Pt—CH$_2$ equatorial), 3.40 (d, 2H, $^3J_{HH}$=8.9 Hz, $^2J_{PtH}$=34.0 Hz, =CH$_2$), 4.16 (m, 2H, —CH=), 4.32 (d, 2H, $^3J_{HH}$=15 Hz, =CH$_2$). $^{13}$C NMR (126 MHz, $C_6D_6$, 20° C.): (28.08 (br s, (—CH$_2$), 28.96 (br s, $^3J_{PtC}$=23 Hz, Me axial), 37.37 (br s, $^3J_{PtC}$=21 Hz, γ-CH$_2$), 37.81 (s, $^3J_{PtC}$=98 Hz, Me equatorial), 40.10 (br s, β-C), 46.73 (s, $^1J_{PtC}$=860.3 Hz, Pt—CH$_2$), 82.99 (br s, =CH$_2$), 104.61 (br s, —CH=).

The molecular structure of cis-bis($\eta^1,\eta^2$-2,2-dimethyl-hex-4-en-1-yl)platinum is similar to that of cis-bis($\eta^1,\eta^2$-2,2-dimethylpent-4-en-1-yl)platinum except that the ligand has one more carbon atom in the chain. The geometry about the Pt center is distorted square planar and the molecule has crystallographic C$_2$ symmetry.

Example 5. Synthesis of [(1,2,5,6-η)-1,5-cyclooctadiene]($\eta^1,\eta^2$-2,2-dimethylpent-4-en-1-yl)iridium A Schlenk flask was charged with $(COD)_2Ir_2Cl_2$ (0.20 g, 0.30 mmol) and THF (20 mL) and cooled to −20° C. To the mixture was added dropwise a cooled (0° C.) solution of (2,2-dimethylpent-4-en-1-yl)lithium (0.089 g, 85 mmol) in pentane (5 mL). The mixture was stirred at −20° C. for 5 h over which time the solution color changed from yellow to red. The pentane was removed under vacuum at −20° C., and THF was removed under vacuum at room temperature. The resulting dark oil was dissolved in pentane (10 mL), the solution was cooled to −20° C., and methanol (~3 mL) was added slowly. Pentane was slowly evaporated at −20° C. under vacuum until the methanol layer turned dark red. This solution was cooled to −78° C. to give single crystals of the title compound as air sensitive dark red needles. The crystals melt at room temperature to form a dark red oil. M.p.<−10° C. HRMS (EI, m/e). Calcd: 398.15853. Found: 398.15781. $^1$H NMR (400 MHz, $C_6D_6$, 20° C.): δ 1.29 (s, 3H), 1.33 (s, 3H, β-CMe$_2$), 1.61 (dd, $^2J_{HH}$=11.3 Hz, $^3J_{HH}$=11.3 Hz, 1H, γ-CH$_2$ axial), 1.74 (d, $^2J_{HH}$=12.4 Hz, 1H, Ir—CH$_2$ axial), 1.94 (dd, $^2J_{HH}$=12.6 HZ, $^4J_{HH}$=2.6 Hz, 1H, Ir—CH$_2$ equatorial), 2.54 (ddd, $^2J_{HH}$=11.8 Hz, $^3J_{HH}$=4.5 Hz, $^4J_{HH}$=2.6 Hz, 1H, γ-CH$_2$ equatorial), 1.57-2.15 (m, 8H, CH$_2$ of COD), 3.00 (m, 1H, CH of COD cis to CH=CH$_2$), 3.18 (d, 1H, $^3J_{HH}$=14.9 Hz, =CH$_2$), 3.50 (d, 1H, $^3J_{HH}$=8.9 Hz, =CH$_2$), 3.78 (m, 1H, CH of COD cis to CH=CH$_2$), 4.06 (m, 1H, CH of COD trans to CH=CH$_2$), 4.29 (m, 1H, CH of COD trans to CH=CH$_2$), 5.19 (m, 1H, —CH=). $^{13}$C NMR (101 MHz, $C_6D_6$, 20° C.): δ 30.20 (s, CH$_2$ of COD cis to CH=CH$_2$), 30.31 (s, Me), 31.96 (s, CH$_2$ of COD trans to CH=CH$_2$), 32.24 (s, CH$_2$ of COD cis to CH=CH$_2$), 32.44 (s, CH$_2$ of COD trans to CH=CH$_2$), 34.29 (s, Me), 52.93 (s, γ-CH$_2$) 55.47 (s, β-C), 63.41 (s, Ir—CH$_2$), 73.11 (s, CH of COD cis to CH=CH$_2$), 74.99 (s, CH of COD trans to CH=CH$_2$), 75.86 (s, CH of COD trans to CH=CH$_2$), 76.60 (s, CH of COD cis to CH=CH$_2$), 77.93 (s, =CH$_2$), 99.20 (s, —CH=).

Figure 3:
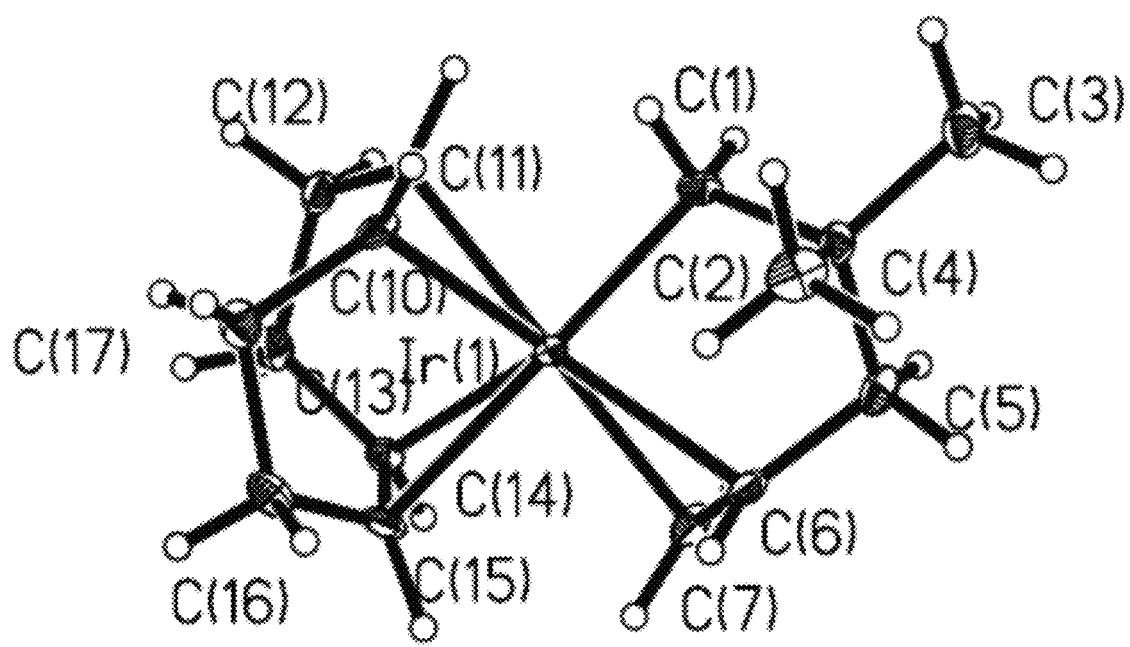
FIG. 3. Molecular structure of [(1,2,5,6-$\eta$)-1,5-cyclooctadiene]($\eta^1,\eta^2$-2,2-dimethylpent-4-en-1-yl)iridium. Ellipsoids are drawn at the 35% probability level.

The crystal structure of [(1,2,5,6-η)-1,5-cyclooctadiene]($\eta^1,\eta^2$-2,2-dimethyl-pent-4-en-1-yl)iridium shows (FIG. 3) that one $\eta^1,\eta^2$-2,2-dimethyl-pent-4-en-1-yl ligand is bound to each iridium center by means of the previously described $\eta^2,\eta^1$ coordination mode. The iridium center has a distorted square planar geometry, and the other two sites in the square plane are occupied by a 1,5-cyclooctadiene ligand.

Example 6. Synthesis of [(1,2,5,6-η)-1,5-cyclooctadiene]($\eta^1,\eta^2$-2,2-dimethylpent-4-en-1-yl)rhodium The synthesis of this compound can be accomplished similar to 20 that described for its iridium analog in example 5, except using $(COD)_2Rh_2Cl_2$ in place of $(COD)_2Ir_2Cl_2$. The product is an orange oil. MS (EI, m/e). Calcd: 308.3. Found: 308.3. $^1$H NMR (400 MHz, $C_6D_6$, 20° C.): (1.11 (dd, $^2J_{HH}$=10.3 Hz, $^4J_{HH}$=3.2 Hz, 1H, Rh—CH$_2$ equatorial), 1.20 (s, 3H, β-CMe$_2$), 1.40 (s, 3H, β-CMe$_2$), 1.43 (d, $^2J_{HH}$=10.3

Hz, 1H, Rh—CH$_2$ axial), 1.70-2.30 (m, 10H, CH$_2$ of COD and γ-CH$_2$), 3.50 (m, 1H, CH of COD), 3.50 (d, 1H, $^3J_{HH}$=15.6 Hz, =CH$_2$), 3.50 (d, 1H, $^3J_{HH}$=8.7 Hz, $^4J_{HH}$=1.4 Hz, =CH$_2$), 4.09 (m, 1H, CH(COD)), 4.38 (m, 1H, CH of COD), 4.77 (m, 1H, CH of COD), 5.74 (m, 1H, —CH=).

Example 7. Synthesis of [(2,3,5,6-)-bicyclo[2.2.1]hepta-2,5-diene](η$^1$,η$^2$-2,2-dimethyl-pent-4-en-1-yl)rhodium The synthesis of this compound can be accomplished similar to that described for its iridium analog in example 5, except using the norbornadiene compound (NBD)$_2$Rh$_2$Cl$_2$ in place of (COD)$_2$Ir$_2$Cl$_2$. The product was obtained as an orange oil. $^1$H NMR (400 MHz, C$_6$D$_6$, 20° C.): δ 0.81 (dd, $^2J_{HH}$=11.4 Hz, $^4J_{HH}$=2.5 Hz, 1H, Rh—CH$_2$ equatorial), 1.17 (d, $^2J_{HH}$=11.8 Hz, 1H, Rh—CH$_2$ axial), 1.22 (s, 3H, β-CMe$_2$), 1.35 (dt, 1H, $^2J_{HH}$=7.8 Hz, $^3J_{HH}$=3.0 Hz, CH bridgehead of NBD), 1.39 (s, 3H, β-CMe$_2$), 1.46 (dt, 1H, $^2J_{HH}$=7.8 HZ, $^3J_{HH}$=3.2 Hz, CH bridgehead of NBD), 1.58 (dd, $^2J_{HH}$=11.6 Hz, $^3J_{HH}$=11.6 Hz, 1H, γ-CH$_2$ axial), 2.48 (ddd, $^2J_{HH}$=11.8 Hz, $^3J_{HH}$=6 Hz, $^4J_{HH}$=3 Hz, 1H, γ-CH$_2$ equatorial), 3.03 (d, 1H, $^3J_{HH}$=15.9 Hz, =CH$_2$), 3.27 (br s, 1H, CH$_2$ of NBD), 3.28 (d, 1H, $^3J_{HH}$=9.1 Hz, =CH$_2$), 3.59 (br s, 1H, CH$_2$ of NBD), 3.98 (m, 1H, CH of NBD), 4.06 (m, 1H, CH of NBD), 4.13 (m, 1H, CH of NBD), 4.57 (m, 1H, CH of NBD), 5.28 (m, 1H, —CH=).

Example 8. Properties of Compositions

Figure 4:
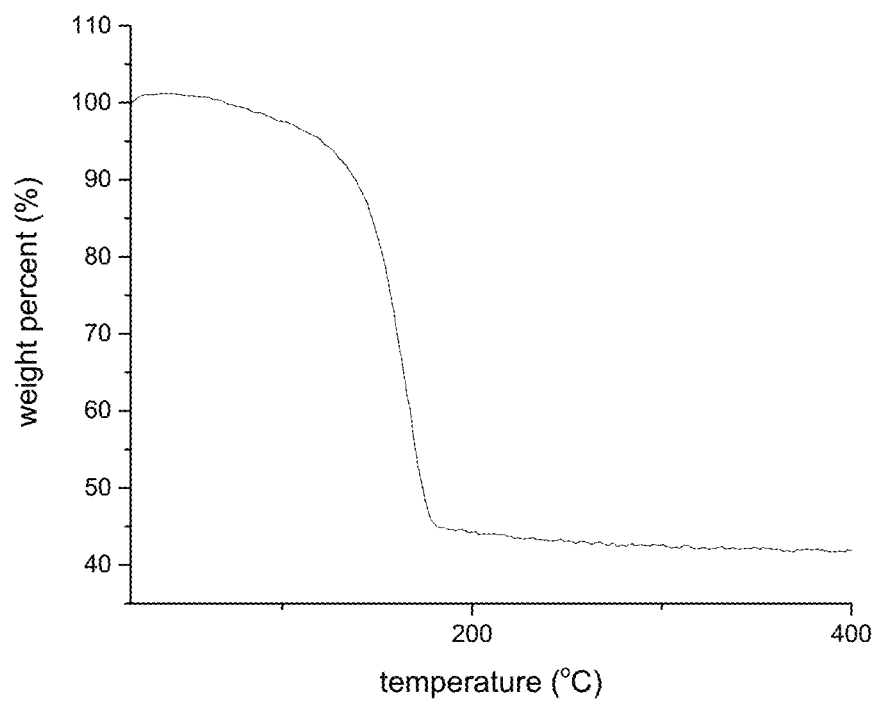
FIG. 4. Thermogravimetric analysis of cis-bis($\eta^1,\eta^2$-2,2-dimethylpent-4-en-1-yl)platinum. TGA pressure=1 atm $N_2$ (little evaporation should take place). Ramp rate=10° C./min. Onset temperature for thermolysis=144° C., final mass=45%. Pt percentage in original compound=50%.
Figure 5:
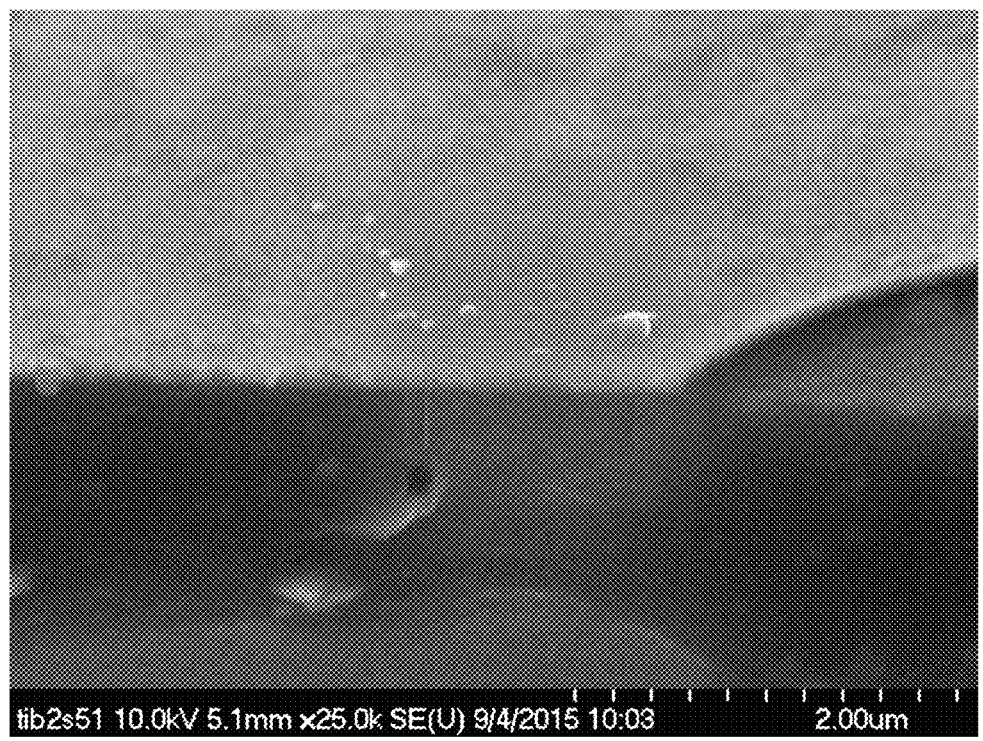
FIG. 5. 150 nm thick platinum film grown from cis-bis($\eta^1,\eta^2$-2,2-dimethylpent-4-en-1-yl)platinum on Si(100) under dynamic vacuum (10 mTorr) in a hot wall glass tube with no co-reactant gas. The precursor reservoir was heated to 80° C., the growth temperature was 250° C.
Figure 6:
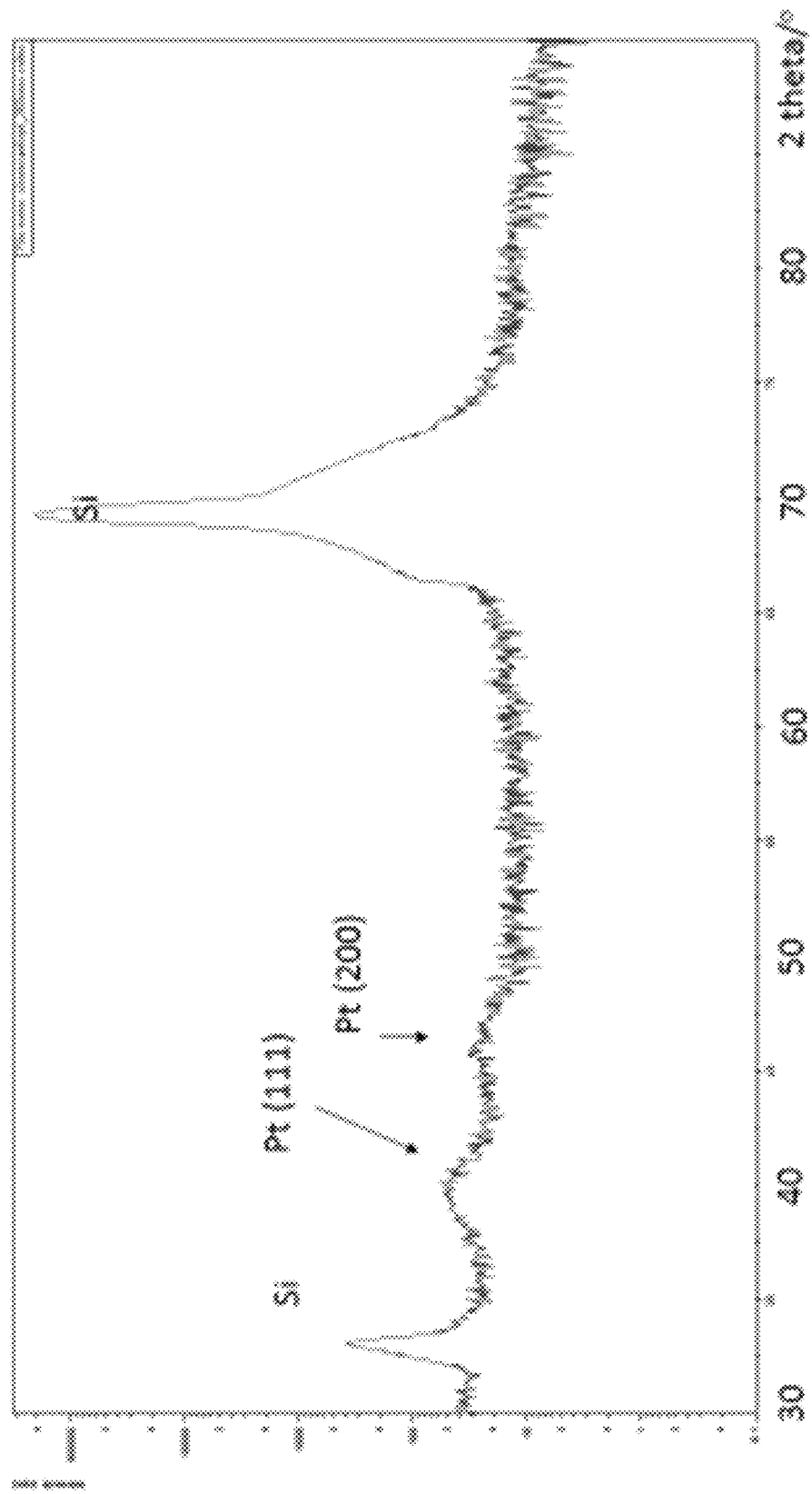
FIG. 6. X-ray diffractogram of the platinum film from FIG. 5, indicating that the film contains nanocrystalline platinum. The y-axis is on a log scale.
Figure 7:
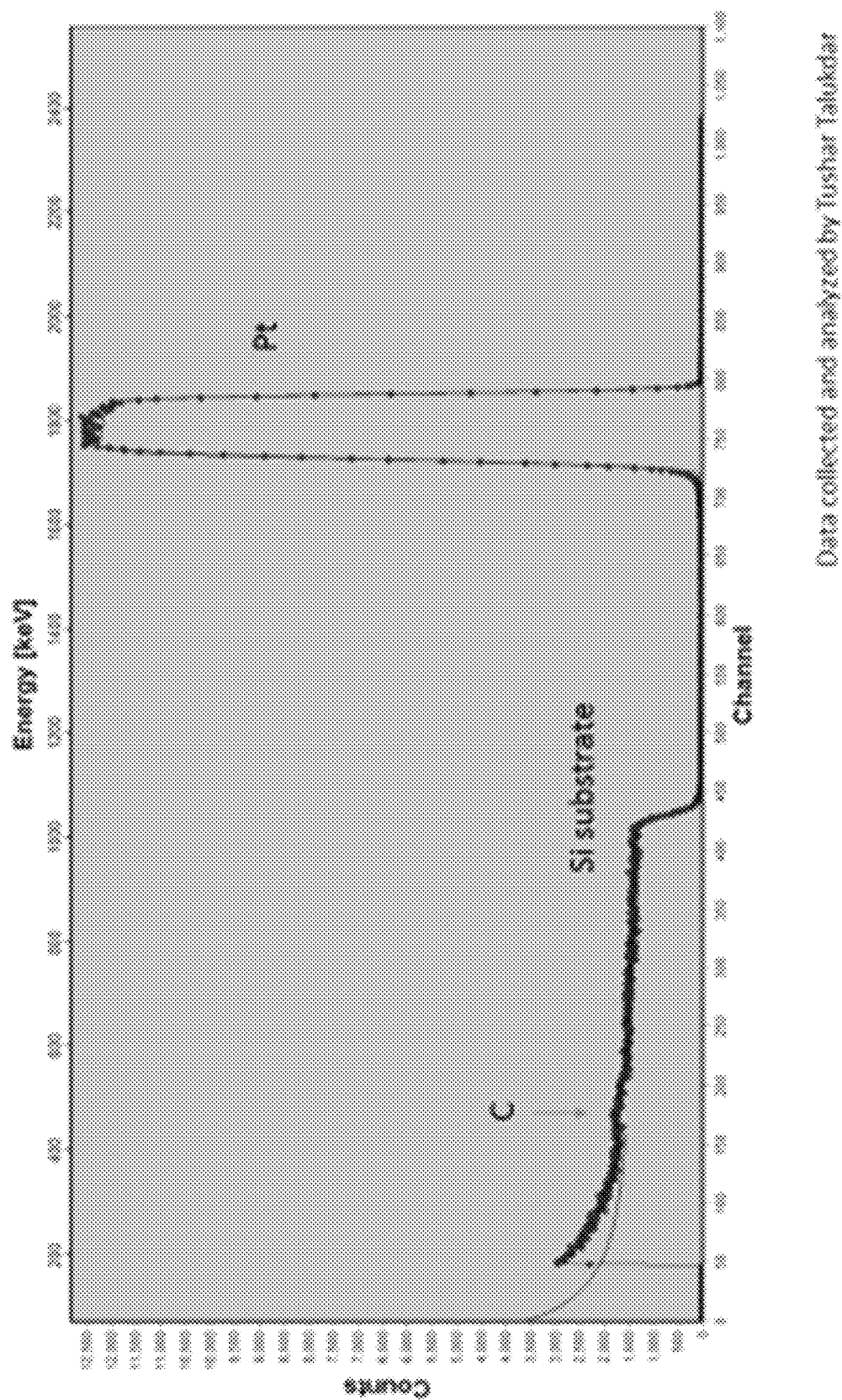
FIG. 7. Rutherford backscattering spectrum of the film from FIG. 5, showing that the film consists of platinum with some carbon contamination.
Figure 8:
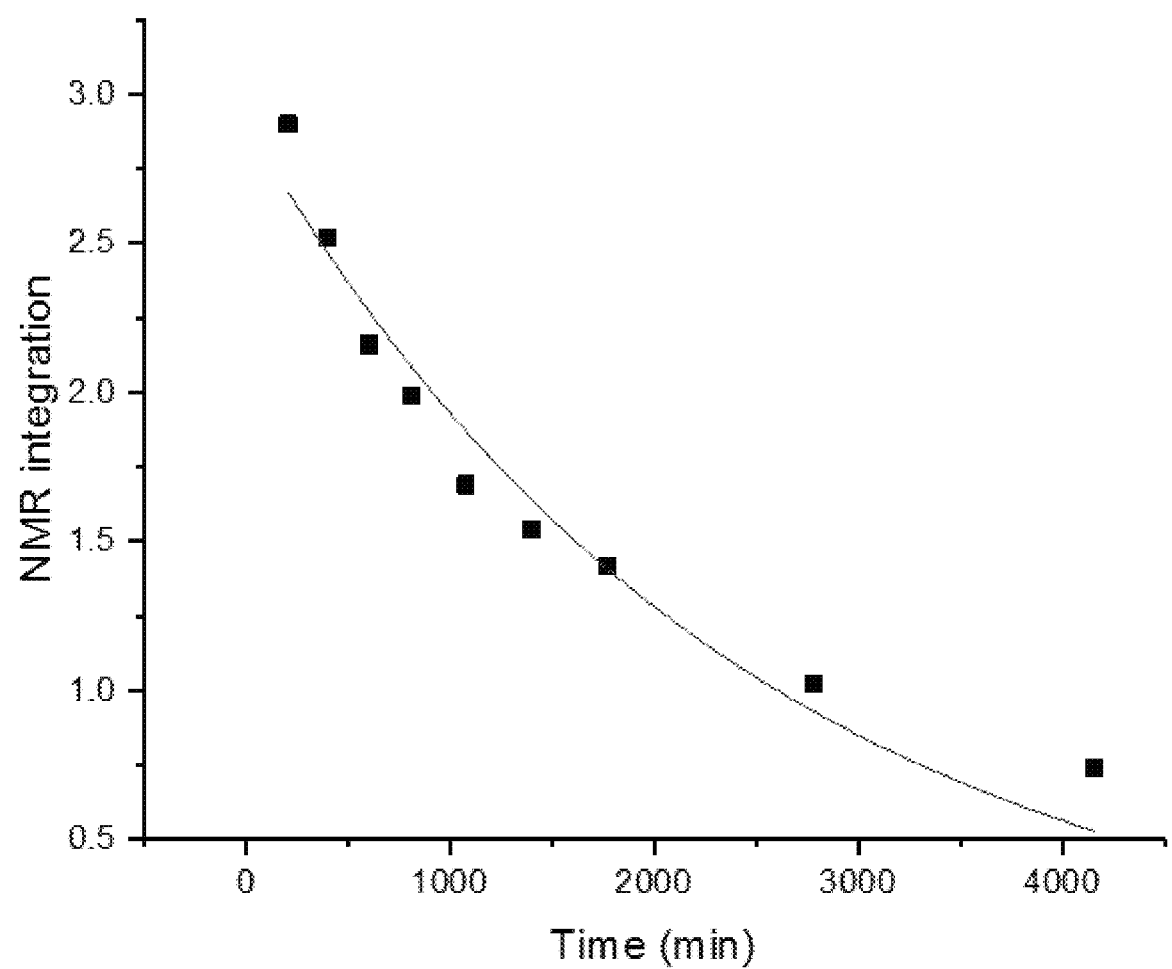
FIG. 8. Decomposition rate of cis-bis($\eta^1,\eta^2$-2,2-dimethylpent-4-en-1-yl)platinum in $C_6F_6$. Thermolysis of cis-bis($\eta^1,\eta^2$-2,2-dimethylpent-4-en-1-yl)platinum in benzene-$d_6$ follows first order kinetics ($I=I_0 e^{-kt}$) with k=4.1 (4)×10$^{-4}$ min$^{-1}$ at 111.5° C. For comparison, thermolysis of the unmethylated analogue bis($\eta^1,\eta^2$-pent-4-en-1-yl)-platinum takes place at a similar rate at much lower temperature: k=4.15×10$^{-4}$ min$^{-1}$ at 85° C. in toluene-$d_8$. This result indicates that the cis-bis($\eta^1,\eta^2$-2,2-dimethylpent-4-en-1-yl) platinum complex is more stable thermally than the unmethylated complex cis-bis(pent-4-en-1-yl)platinum made by Tagge et al. (Tagge, C. D.; Simpson, R. D.; Bergman, R. G.; Hostetler, M. J.; Girolami, G. S.; Nuzzo, R. G., "Synthesis of a novel volatile platinum complex for use in CVD and a study of the mechanism of its thermal decomposition in solution." J. Am. Chem. Soc. 1996, 118, 2634-2643).
Figure 9A:
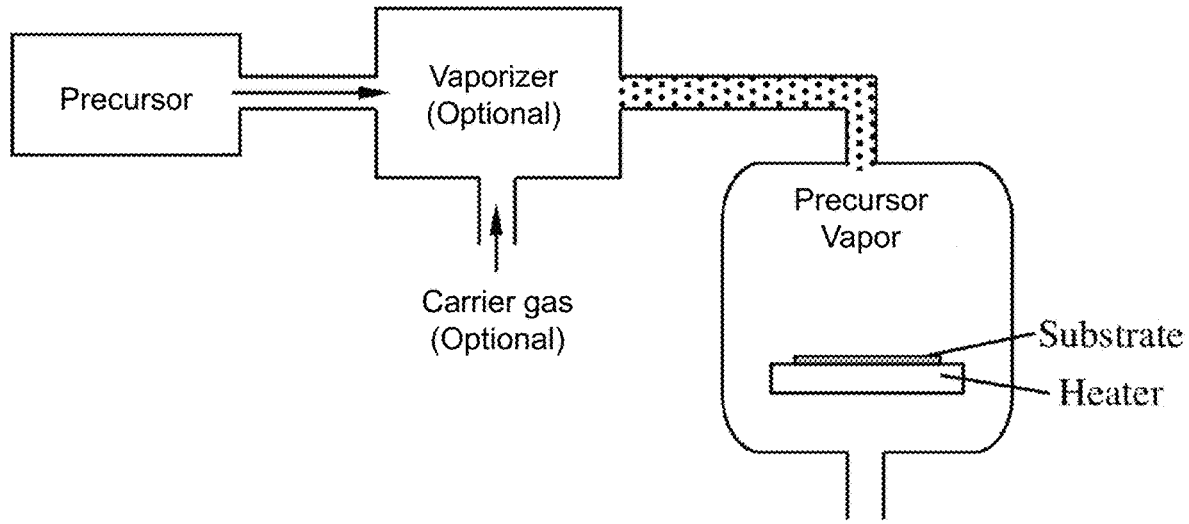
FIGS. 9A-9B.
Figure 9B:
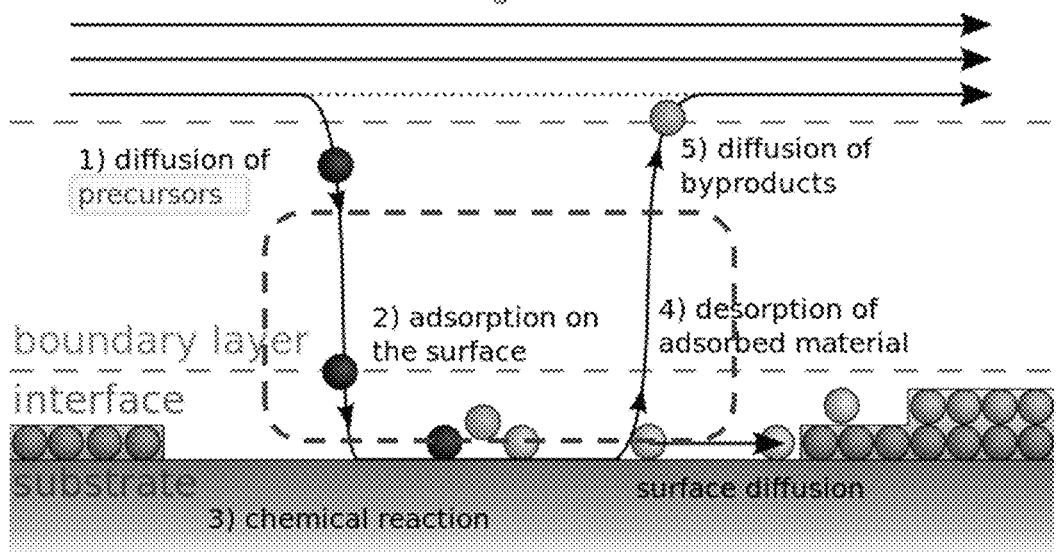
Figure 10:
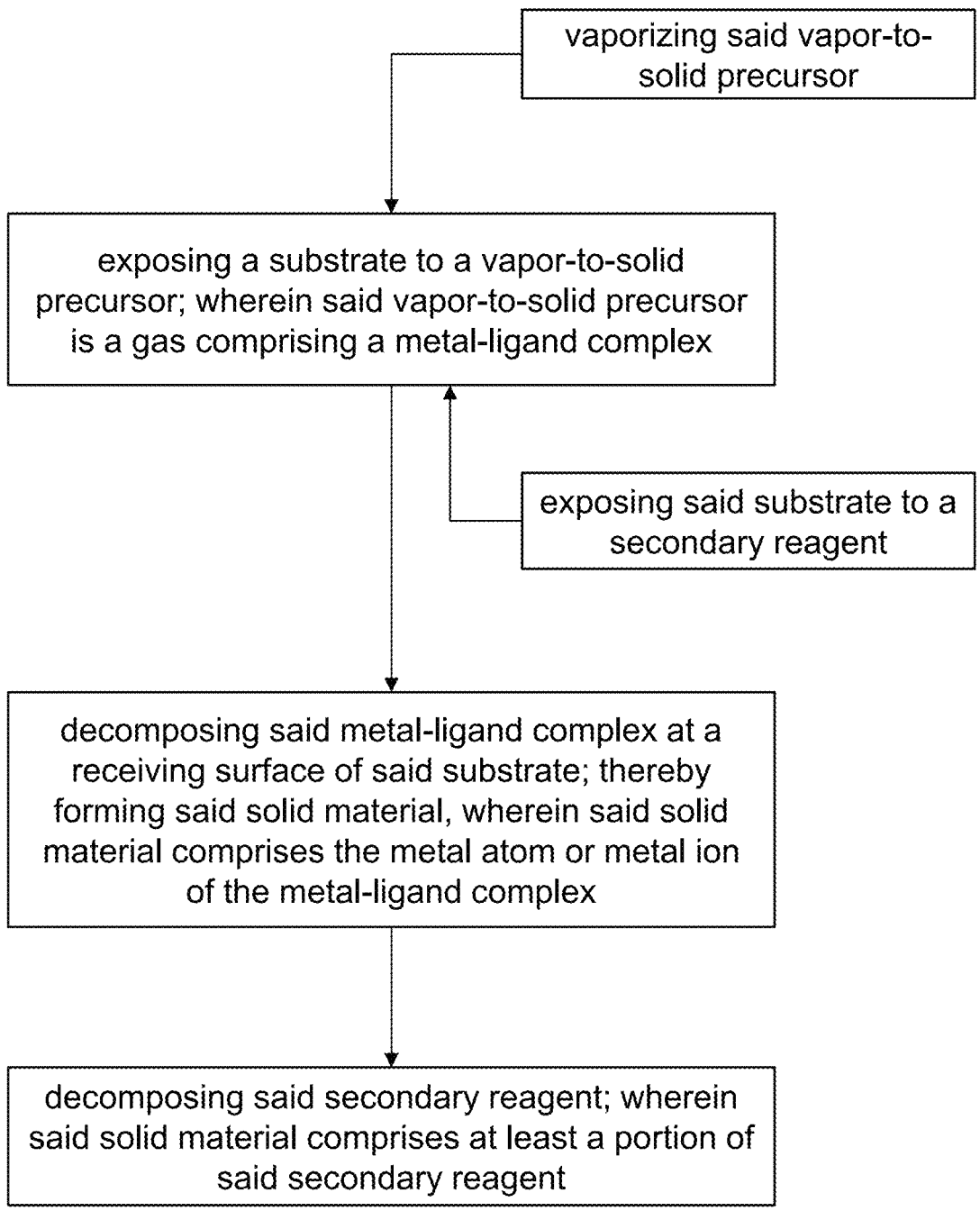
FIG. 10. Illustration of a method for depositing a solid material onto a substrate.

FIG. 4 shows a thermogravimetric analysis of one embodiment of the present compositions, the new platinum compound cis-bis(η$^1$,η$^2$-2,2-dimethylpent-4-en-1-yl)platinum. The results suggest that this should be an excellent CVD precursor. TGA pressure=1 atm N$_2$ (little evaporation should take place), ramp rate=10° C./min, onset temperature for thermolysis=144° C., final mass=45%, and Pt percentage in original compound=50%. FIG. 5 shows ~150 nm platinum film grown from cis-bis(η$^1$,η$^2$-2,2-dimethylpent-4-en-1-yl)platinum on Si(100) under dynamic vacuum. The precursor reservoir was heated to 80° C., and the growth temperature was 250° C. FIG. 6, which shows the X-ray diffractogram of the platinum film in FIG. 5, indicating that the film contains nanocrystalline platinum. FIG. 7 shows that the film in FIG. 5 consists of platinum with some carbon impurity. The amount of carbon is comparable with that found for state-of-the-art platinum precursors in absence of a reactive gas (Thurier et al., *Coordination Chemistry Reviews* 2008, 252, 155-169; Schneider, et al., *Chemical Vapor Deposition* 2007, 13, 389-395; Maudez, et al., *Chemical Vapor Deposition* 2014, 20, 59-68). FIG. 8 shows the decomposition rate of cis-bis(η$^1$,η$^2$-2,2-dimethylpent-4-en-1-yl)-platinum, which indicates that this compound more thermally stable than the 2,2-unmethylated analogue.

In summary, this data shows that, in one embodiment of the present invention, films containing platinum can be grown at 250° C. from the precursor cis-bis(η$^1$,η$^2$-2,2-dimethylpent-4-en-1-yl)platinum.

Example 9: Exemplary Compositions, Formulations, and Methods (i) A metal ligand complex characterized by formula (FX1): ML$_x$D$_y$ (FX1); wherein: M is a metal chosen from the group consisting of Li, Be, Mg, Ca, Sr, Ba, Al, Sc, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal; x is equal to the oxidation state of M; D is a neutral coordinating ligand; y is zero or an integer from 1 to 4; and L is a η$^1$,η$^2$-β,β-disubstituted-ω-alkenyl group that has the structure characterized by formula FX2:

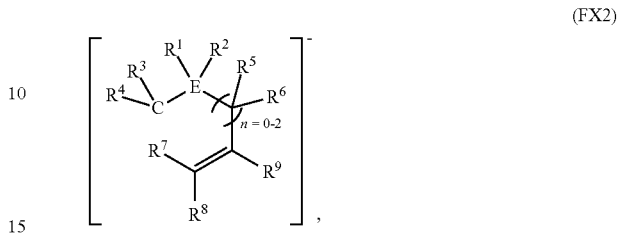

(FX2)

wherein, R$^1$ and R$^2$ may be the same as or different from one another and each of R$^1$ and R$^2$ are selected from the group consisting of C$_1$-C$_6$ alkyl, C$_3$-C$_8$ cycloalkyl, haloalkyl, arylalkyl, alkoxy, C$_6$-C$_{10}$ aryl, substituted aryl, heteroaryl, silyl, alkenyl, alkynyl, and halogen; R$^3$, R$^4$, R$^5$, R$^6$, R$^7$, R$^8$, and R$^9$ may be the same as or different from one another and selected from the group consisting of H, C$_1$-C$_6$ alkyl, C$_3$-C$_8$ cycloalkyl, haloalkyl, arylalkyl, alkoxy, C$_6$-C$_{10}$ aryl, substituted aryl, heteroaryl, silyl, alkenyl, alkynyl, and halogen; and E is C or Si.

(ii) Any metal ligand complex of this Example, wherein E is Si.

(iii) Any metal ligand complex of this Example, wherein R$^1$, R$^2$, R$^3$, R$^4$, R$^5$, R$^6$, R$^7$, R$^8$, and R$^9$ are connected to each other by alkyl groups or fluoroalkyl groups.

(iv) Any metal ligand complex of this Example, wherein the R$^1$ and R$^2$ are alkyl groups, fluoroalkyl groups or other non-metal atoms or groups; R$^3$, R$^4$, R$^5$, R$^6$, R$^7$, R$^8$, and R$^9$ are hydrogen, alkyl groups, fluoroalkyl groups or other non-metal atoms or groups, and wherein R$^1$, R$^2$, R$^3$, R$^4$, R$^5$, R$^6$, R$^7$, R$^8$, and R$^9$ are the same or different, and wherein R$^1$, R$^2$, R$^3$, R$^4$, R$^5$, R$^6$, R$^7$, R$^8$, and R$^9$ are connected to each other by alkyl groups or fluoroalkyl groups.

(v) Any metal ligand complex of this Example, wherein D is selected from the group consisting of 1,5-cyclooctadiene, bicyclo[2.2.1]hepta-2,5-diene, 1,5-hexadiene, ethylene, dibenzo[a,e]cyclooctene, N,N,N',N'-tetramethylethylenediamine, and acetonitrile.

(vi) Any metal ligand complex of this Example, herein M is selected from the group consisting of lithium, magnesium, rhodium, iridium, platinum, ruthenium, and osmium.

(vii) A substrate comprising a film or nanostructures comprising any metal ligand complex of this Example.

(viii) A method for depositing metal containing films or nanostructures, the method comprising vaporizing any metal ligand complex of this Example and decomposing the metal ligand complex on a substrate.

(ix) Any method of this Example, wherein the metal ligand complex is delivered and decomposed by chemical vapor deposition or atomic layer deposition.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is 15 interchangeable with the expression "as in any one of claims XX-YY."

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Certain molecules disclosed herein may contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Where used, a bond represented by "〜〜" (a squiggly or wavy line) refers to a bond having any angle or geometry, such as in the case of a chemical species exhibiting stereochemistry such as chirality. For example, the compound characterized by formula (FX100):

(FX100)

may correspond to one or more compounds, such as those characterized by the formulas (FX100a), (FX100b), (FX100c), and (FX100d):

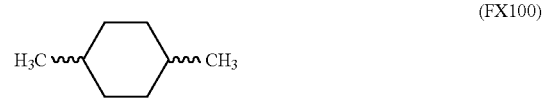

(FX100a)

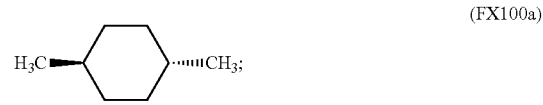

(FX100b)

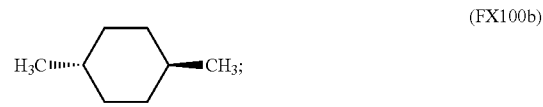

(FX100c)

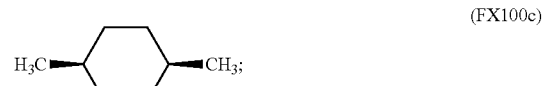

(FX100d)

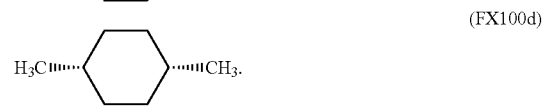

It must also be noted that a bond represented as a non-wavy or non-squiggly line, such as a "———", may exhibit more than one stereochemical configuration, such as chirality. In other words, the compound characterized by formula (FX100e):

(FX100e)

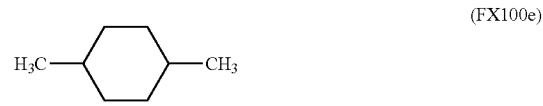

may correspond to one or more compounds, such as those characterized by the formulas (FX100a), (FX100b), (FX100c), and (FX100d).

Every composition, formulation, catalyst, precursor, complex, combination thereof, or method described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, reagents, synthetic methods, purification methods, analytical methods, assay methods, and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A metal-ligand complex, said metal-ligand complex being characterized by formula (FX1):

$$ML_xD_y, \qquad (FX1)$$

wherein:
M is a metal selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;
x is equal to the oxidation state of M;
each D is independently a neutral coordinating ligand;
y is zero or an integer selected from the range of 1 to 4; and each L is a mono-anionic ligand independently characterized by the formula FX2:

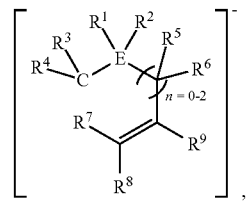

(FX2)

and wherein:
each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;
each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and
E is C or Si;
with a proviso that at least one of $R^1$ and $R^2$ is not a fluoride or a trifluoromethyl; and
wherein M is associated with each L via both a metal-carbon sigma bond and a metal-olefin pi bond.

2. The metal-ligand complex of claim 1, wherein at least one of $R^1$ and $R^2$ is not a fluoride or a $C_1$-$C_6$ fluoroalkyl.

3. The metal-ligand complex of claim 1, wherein each of both $R^1$ and $R^2$ is not a fluoride or a trifluoromethyl.

4. The metal-ligand complex of claim 1, wherein each of both $R^1$ and $R^2$ is not a fluoride or a $C_1$-$C_6$ fluoroalkyl.

5. The metal-ligand complex of claim 1, wherein M is selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, and a lanthanide metal.

6. The metal-ligand complex of claim 1, wherein a coordination number of M is 4 or 6.

7. The metal-ligand complex of claim 1, wherein L is a $\eta^1$, $\eta^2$-β, β-disubstituted-ω-alkenyl ligand.

8. The metal-ligand complex of claim 1, wherein when x is greater than 1, each L is identical.

9. The metal-ligand complex of claim 1, wherein when x is greater than 1, each L is different from each other L.

10. The metal-ligand complex of claim 1 wherein the total number of carbon atoms in each L excluding $R^1$, $R^2$, $R^3$, $R^4$, $R^5$, $R^6$, $R^7$, $R^8$, and $R^9$ is independently 4 or 5.

11. The metal-ligand complex of claim 1, wherein when x is greater than 1, the metal-carbon sigma bonds in said metal-ligand complex are cis with respect to each other.

12. The metal-ligand complex of claim 1, wherein L is a bidentate ligand.

13. The metal-ligand complex of claim 1, wherein each D independently comprises an ether group ($R^{10}{}_2O$), an amine group ($R^{10}{}_3N$), a nitrile group ($R^{10}CN$), an isonitrile group ($R^{10}NC$), a phosphine group ($R^{10}{}_3P$), a phosphite group (($R^{10}O)_3P$), an arsine group ($R^{10}{}_3As$), a stibene group ($R^{10}{}_3Sb$), a sulfide group (CS), a linear, branched, or cyclic monoalkene, a linear, branched, or cyclic diene, a linear, branched, or cyclic triene, bicyclic alkene, bicyclic dienes bicyclic triene, tricyclic diene, tricyclic triene, alkyne, and any combination thereof; wherein each $R^{10}$ is independently selected from the group consisting of a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, and any combination thereof.

14. The metal-ligand complex of claim 1, wherein each D is independently selected from the group consisting of 1,5-cyclooctadiene, bicyclo[2.2.1]hepta-2,5-diene, 1,5-hexadiene, ethylene, dibenzo[a,e]cyclooctene, N,N,N',N'-tetramethylethylenediamine, and acetonitrile.

15. The metal-ligand complex of claim 1, wherein y is 0.

16. The metal-ligand complex of claim 1 being selected from the group consisting of cis-bis($\eta^1$, $\eta^2$-2,2-dimethylbut-3-en-1-yl)platinum, cis-bis($\eta^1$, $\eta^2$-2,2-dimethylpent-4-en-1-yl)platinum, cis-bis($\eta^1$, $\eta^2$-2,2-dimethylhex-5-en-1-yl)platinum, [(1,2,5,6-$\eta$)-1,5-cyclooctadiene]($\eta^1$, $\eta^2$-2,2-dimethylpent-4-en-1-yl)iridium, [(1,2,5,6-$\eta$)-1,5-cyclooctadiene]($\eta^1$, $\eta^2$-2,2-dimethylpent-4-en-1-yl)rhodium, and [(2,3,5,6-$\eta$)-bicyclo[2.2.1]hepta-2,5-diene]($\eta^1$, $\eta^2$-2,2-dimethyl-pent-4-en-1-yl)rhodium.

17. The metal-ligand complex of claim 1 being characterized by the formula FX3:

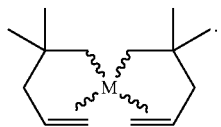

(FX3)

18. The metal-ligand complex of claim 1 being characterized by the formula FX4:

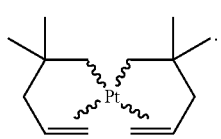

(FX4)

19. The metal-ligand complex of claim 1, wherein less than 10 mass % of said metal-ligand complex decomposes after two weeks when stored under at least 1 atm of one or more inert gases at room temperature.

20. The metal-ligand complex of claim 1 having a thermolysis onset temperature selected from the range of 50° C. to 300° C.; wherein said thermolysis onset temperature is measured using thermogravimetric analysis with a temperature increase rate of 10° C./min and under approximately 1 atm of $N_2$.

21. The metal-ligand complex of claim 1, wherein said metal-ligand complex does not decompose via beta-hydrogen elimination at NTP.

22. The metal-ligand complex of claim 1 being a hydrosilylation catalyst or a hydrosilylation catalyst precursor.

23. The metal-ligand complex of claim 1 being a vapor-to-solid precursor.

24. The metal-ligand complex of claim 1, wherein M has an oxidation number of at least +2.

25. A vapor-to-solid precursor comprising a metal-ligand complex, said metal-ligand complex being characterized by formula (FX1):

$$ML_xD_y \quad (FX1),$$

wherein:
M is a metal selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;
x is equal to the oxidation state of M;
each D is independently a neutral coordinating ligand;
y is zero or an integer selected from the range of 1 to 4; and
each L is a mono-anionic ligand independently characterized by the formula FX2:

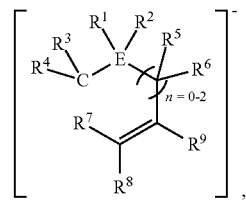

(FX2)

and wherein:
each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;
each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and
E is C or Si; and
wherein M is associated with each L via both a metal-carbon sigma bond and a metal-olefin pi bond.

26. The vapor-to-solid precursor of claim 25, wherein M has an oxidation number of at least +2.

27. A method for depositing a solid material on a substrate, said method comprising steps of:
exposing a receiving surface of said substrate to a vapor of a vapor-to-solid precursor;
wherein said vapor-to-solid precursor comprises a metal-ligand complex;

wherein said metal-ligand complex is characterized by formula (FX1):

(FX1), wherein:
M is a metal selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;
x is equal to the oxidation state of M;
each D is independently a neutral coordinating ligand;
y is zero or an integer selected from the range of 1 to 4; and
each L is a mono-anionic ligand independently characterized by the formula FX2:

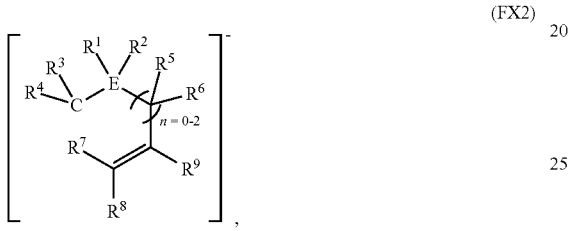

(FX2)

and wherein:
each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;
each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;
E is C or Si; and
wherein M is associated with each L via both a metal-carbon sigma bond and a metal-olefin pi bond; and
decomposing said metal-ligand complex at said receiving surface of said substrate;
thereby forming said solid material, wherein said solid material comprises M.

28. A method for forming a metal-ligand complex, comprising:
combining a starting compound and a Grignard reagent or an organolithium reagent;
wherein said metal-ligand complex is characterized by formula (FX1):

(FX1), wherein:
M is a metal selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;
x is equal to the oxidation state of M;
each D is independently a neutral coordinating ligand;
y is zero or an integer selected from the range of 1 to 4; and
each L is a mono-anionic ligand independently characterized by the formula FX2:

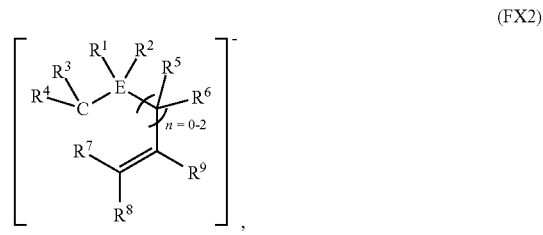

(FX2)

and wherein:
each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;
each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;
E is C or Si; and
wherein M is associated with each L via both a metal-carbon sigma bond and a metal-olefin pi bond.

29. A method for catalytic hydrosilylation of a starting compound, said method comprising steps of:
hydrosilylating said starting compound in the presence of a hydrosilylation catalyst;
wherein said hydrosilylation catalyst comprises a metal-ligand complex or wherein said hydrosilylation catalyst is formed by activation of a hydrosilylation precatalyst that comprises said metal-ligand complex; and
wherein said metal-ligand complex is characterized by formula (FX1):

(FX1), where:
M is a metal selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;
x is equal to the oxidation state of M;
each D is independently a neutral coordinating ligand;
y is zero or an integer selected from the range of 1 to 4; and each L is a mono-anionic ligand independently characterized by the formula FX2:

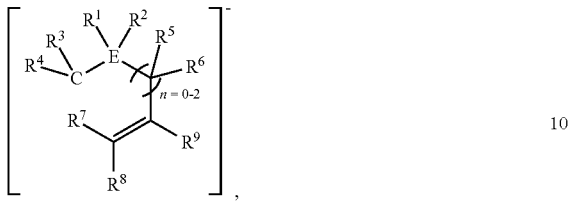

(FX2)

where:
each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;

each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;

E is C or Si; and
wherein M is associated with each L via both a metal-carbon sigma bond and a metal-olefin pi bond.

30. A metal-ligand complex, said metal-ligand complex being characterized by formula (FX1):

$$ML_xD_y \quad (FX1),$$

wherein:
M is a metal selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;
x is equal to the oxidation state of M;
each D is independently a neutral coordinating ligand;
y is zero or an integer selected from the range of 1 to 4; and
each L is a mono-anionic ligand independently characterized by the formula FX2:

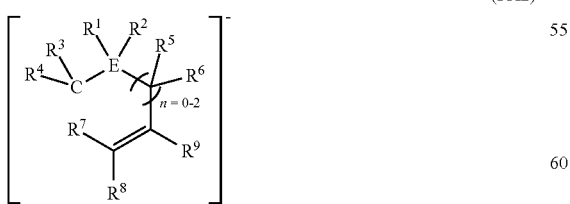

(FX2)

and wherein:
each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;

each of $R^3$, $R^4$, $R^5$, $R^6$, $R^7$, Fe, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si;
with a proviso that at least one of $R^1$ and $R^2$ is not a fluoride or a trifluoromethyl; and
wherein when x is greater than 1, each L is different from each other L.

31. A metal-ligand complex, said metal-ligand complex being characterized by formula (FX1):

$$ML_xD_y \quad (FX1),$$

wherein:
M is a metal selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;
x is equal to the oxidation state of M;
each D is independently a neutral coordinating ligand;
y is an integer selected from the range of 1 to 4; and
each L is a mono-anionic ligand independently characterized by the formula FX2:

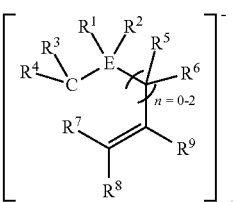

(FX2)

and wherein:
each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;

each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si;
with a proviso that at least one of $R^1$ and $R^2$ is not a fluoride or a trifluoromethyl;

wherein each D independently comprises an ether group ($R^{10}_2O$), an amine group ($R^{10}_3N$), a nitrile group ($R^{10}CN$), an isonitrile group ($R^{10}NC$), a phosphine group ($R^{10}_3P$), a phosphite group (($R^{10}O)_3P$), an arsine group ($R^{10}_3As$), a stibene group ($R^{10}_3Sb$), a sulfide group ($R^{10}_2S$), a linear, branched, or cyclic monoalkene, a linear, branched, or cyclic diene, a linear, branched, or cyclic triene, bicyclic alkene, bicyclic dienes bicyclic triene, tricyclic diene, tricyclic triene, alkyne, and any combination thereof; wherein each $R^{10}$ is independently selected from the group consisting of a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, and any combination thereof; and wherein M is associated with each L via both a metal-carbon sigma bond and a metal-olefin pi bond.

32. A metal-ligand complex, said metal-ligand complex being characterized by formula (FX1):

$$ML_xD_y \quad (FX1),$$

wherein:

M is a metal selected from the group consisting of Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;

x is equal to the oxidation state of M;

each D is independently a neutral coordinating ligand;

y is an integer selected from the range of 1 to 4; and each L is a mono-anionic ligand independently characterized by the formula FX2:

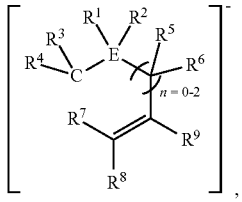

(FX2)

and wherein:

each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;

each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si;

with a proviso that at least one of $R^1$ and $R^2$ is not a fluoride or a trifluoromethyl;

wherein each D is independently selected from the group consisting of 1,5-cyclooctadiene, bicyclo [2.2.1]hepta-2,5-diene, 1,5-hexadiene, ethylene, dibenzo[a,e]cyclooctene, N, N, N',N'-tetramethylethylenediamine, and acetonitrile; and wherein M is associated with each L via both a metal-carbon sigma bond and a metal-olefin pi bond.

33. A metal-ligand complex, wherein the metal-ligand complex is characterized by the formula FX4:

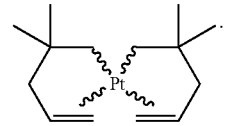

(FX4)

* * * * *

UNITED STATES PATENT AND TRADEMARK OFFICE
CERTIFICATE OF CORRECTION

Page 1 of 1

PATENT NO. : 11,008,353 B2
APPLICATION NO. : 16/035348
DATED : May 18, 2021
INVENTOR(S) : Girolami et al.

It is certified that error appears in the above-identified patent and that said Letters Patent is hereby corrected as shown below:

In the Claims

• In Claim 30 (Column 50, Line 6), please replace "each of R3, R4, R5, R6, R7, Fe and R9" with --each of R3, R4, R5, R6, R7, R8, and R9--.

Signed and Sealed this
Seventh Day of December, 2021

Drew Hirshfeld
*Performing the Functions and Duties of the
Under Secretary of Commerce for Intellectual Property and
Director of the United States Patent and Trademark Office*